(12) United States Patent
Jeong et al.

(10) Patent No.: US 10,551,969 B2
(45) Date of Patent: Feb. 4, 2020

(54) DISPLAY DEVICE

(71) Applicant: Samsung Display Co., Ltd., Yongin-si, Gyeonggi-do (KR)

(72) Inventors: Changyong Jeong, Yongin-si (KR); Mugyeom Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/714,612

(22) Filed: Sep. 25, 2017

(65) Prior Publication Data

US 2018/0088736 A1    Mar. 29, 2018

(30) Foreign Application Priority Data

Sep. 27, 2016   (KR) ........................ 10-2016-0123855

(51) Int. Cl.
  *G06F 3/041* (2006.01)
  *H01L 27/32* (2006.01)

(52) U.S. Cl.
  CPC .......... *G06F 3/0418* (2013.01); *G06F 3/0412* (2013.01); *G06F 3/0414* (2013.01); *H01L 27/323* (2013.01); *G06F 3/04142* (2019.05); *G06F 2203/04103* (2013.01)

(58) Field of Classification Search
  CPC . G06F 2203/04105; G06F 2203/04107; G06F 2203/04112; G06F 3/0412; G06F 3/0416; G06F 3/044; G06F 2203/04142; G06F 2203/04103; G06F 3/0414; G06F 3/0418; G06F 3/0428; H01L 27/323; H01L 27/3248; H01L 51/0097
  See application file for complete search history.

(56) References Cited

U.S. PATENT DOCUMENTS

| 7,183,948 | B2* | 2/2007 | Roberts | G06F 3/0414 341/34 |
| 7,920,225 | B2* | 4/2011 | Nishikawa | G06F 1/1626 349/11 |
| 8,169,416 | B2* | 5/2012 | Han | G06F 3/044 345/173 |
| 8,243,225 | B2* | 8/2012 | Kai | G06F 3/0414 349/12 |
| 8,436,823 | B2* | 5/2013 | Kanehira | G06F 3/044 178/18.06 |
| 8,711,122 | B2* | 4/2014 | Wada | G06F 3/044 345/173 |

(Continued)

FOREIGN PATENT DOCUMENTS

| KR | 1020110075134 A | 7/2011 |
| KR | 1020150141072 A | 12/2015 |
| KR | 1020160063540 A | 6/2016 |

*Primary Examiner* — Michael J Jansen, II
(74) *Attorney, Agent, or Firm* — Innovation Counsel LLP

(57) ABSTRACT

A display device is capable of substantially minimizing sensing errors and substantially minimizing a pressure applied to a pixel area during a touch action, the display device including: a frame; a window facing at least a portion of the frame; a panel support portion between the window and a base portion of the frame; a flexible display panel including a central portion between the panel support portion and the window and an edge portion between the panel support portion and the base portion of the frame; and a first pressure sensing unit between the edge portion and the panel support portion.

26 Claims, 11 Drawing Sheets

(56) References Cited

U.S. PATENT DOCUMENTS

| | | | |
|---|---|---|---|
| 8,981,246 B2* | 3/2015 | Sano | H01H 13/14 200/246 |
| 9,354,752 B2* | 5/2016 | Kanehira | G06F 3/0414 |
| 9,857,928 B2* | 1/2018 | Kemppinen | G06F 3/044 |
| 10,048,789 B2* | 8/2018 | Filiz | G06F 3/0414 |
| 10,126,185 B2* | 11/2018 | Watanabe | G01L 1/205 |
| 10,244,659 B2* | 3/2019 | Jarvis | H01M 2/1016 |
| 10,261,616 B2* | 4/2019 | Jeong | H01L 27/323 |
| 2002/0149571 A1* | 10/2002 | Roberts | G06F 3/0414 345/174 |
| 2002/0175836 A1* | 11/2002 | Roberts | G06F 3/0414 341/34 |
| 2009/0231305 A1 | 9/2009 | Hotelling et al. | |
| 2010/0020041 A1 | 1/2010 | Park et al. | |
| 2010/0053854 A1* | 3/2010 | Nishikawa | G06F 1/1626 361/679.01 |
| 2011/0025631 A1* | 2/2011 | Han | G06F 3/0414 345/173 |
| 2011/0026202 A1* | 2/2011 | Kai | G06F 3/0414 361/679.01 |
| 2011/0148811 A1* | 6/2011 | Kanehira | G06F 3/044 345/174 |
| 2011/0157087 A1* | 6/2011 | Kanehira | G06F 3/0414 345/174 |
| 2012/0068965 A1* | 3/2012 | Wada | G06F 3/0414 345/174 |
| 2012/0098767 A1* | 4/2012 | Takai | G06F 3/041 345/173 |
| 2013/0050126 A1* | 2/2013 | Kimura | G02F 1/13338 345/173 |
| 2013/0228427 A1* | 9/2013 | Sano | H01H 13/14 200/295 |
| 2014/0028575 A1 | 1/2014 | Parivar et al. | |
| 2014/0111953 A1* | 4/2014 | McClure | G06F 3/044 361/749 |
| 2014/0320762 A1 | 10/2014 | Jeong et al. | |
| 2014/0354617 A1 | 12/2014 | Nam et al. | |
| 2015/0370376 A1* | 12/2015 | Harley | G06F 3/0414 345/174 |
| 2016/0103544 A1* | 4/2016 | Filiz | G06F 3/0414 345/174 |
| 2016/0139716 A1* | 5/2016 | Filiz | G06F 3/0414 345/174 |
| 2016/0147375 A1 | 5/2016 | Bok et al. | |
| 2016/0327440 A1* | 11/2016 | Watanabe | G01L 1/205 |
| 2017/0068348 A1* | 3/2017 | Kemppinen | G06F 3/044 |
| 2018/0004333 A1* | 1/2018 | Jeong | G06F 3/044 |
| 2018/0081481 A1* | 3/2018 | Fournier | G06F 3/0412 |
| 2018/0083322 A1* | 3/2018 | Pakula | G06F 3/0412 |
| 2018/0084636 A1* | 3/2018 | Pakula | G06F 3/0412 |
| 2018/0084680 A1* | 3/2018 | Jarvis | G06F 3/0412 |
| 2018/0088736 A1* | 3/2018 | Jeong | G06F 3/0412 |

* cited by examiner

DISPLAY DEVICE

CROSS-REFERENCE TO RELATED APPLICATION

This application claims priority under 35 U.S.C. § 119 to Korean Patent Application No. 10-2016-0123855, filed on Sep. 27, 2016, in the Korean Intellectual Property Office (KIPO), the disclosure of which is incorporated by reference herein in its entirety.

1. TECHNICAL FIELD

Embodiments of the present inventive concept relate to a display device capable of substantially minimizing sensing errors and substantially minimizing a pressure applied to a pixel area during a touch action.

2. DISCUSSION OF RELATED ART

Display devices having characteristics such as a low power consumption, a small thickness and a small size have been widely used. Generally, display devices include a display panel, an accommodation container, a touch panel and the like.

As the demand for slimness and lightening of the display device has increased, display devices are being developed in which the display panel and the touch panel are brought into close contact to reduce the thickness.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments of the present inventive concept may be directed to a display device capable of substantially minimizing sensing errors and substantially minimizing a pressure applied to a pixel area during a touch action.

According to an exemplary embodiment, a display device includes: a frame; a window facing at least a portion of the frame; a panel support portion between the window and a base portion of the frame; a flexible display panel including a central portion between the panel support portion and the window and an edge portion between the panel support portion and the base portion of the frame; and a first pressure sensing unit between the edge portion and the panel support portion.

The display device may further include at least one of: a second pressure sensing unit between a side portion protruding from an edge of the frame and an edge of the window; and a third pressure sensing unit between the flexible display panel and the window.

At least two pressure sensing units of the first, second and third pressure sensing units may have different sensitivities.

The third pressure sensing unit may have a highest sensitivity, the second pressure sensing unit may have a lowest sensitivity, and the first pressure sensing unit may have a sensitivity higher than the sensitivity of the second pressure sensing unit and less than the sensitivity of the third pressure sensing unit.

At least two pressure sensing units of the first, second and third pressure sensing units may include elastic elements having different moduli.

The third pressure sensing unit may include an elastic element having a greatest modulus, the second pressure sensing unit may include an elastic element having a smallest modulus, and the first pressure sensing unit may include an elastic element having a modulus that is greater than the modulus of the second pressure sensing unit and less than the modulus of the third pressure sensing unit.

The elastic element of the first pressure sensing unit may have a thickness greater than or equal to a thickness of the elastic element of the second pressure sensing unit, and the elastic element of the third pressure sensing unit may have a thickness less than the thickness of the elastic element of the first pressure sensing unit.

The display device may further include a panel driving unit controlling an operation of the flexible display panel based on a first pressure sensing signal from the first pressure sensing unit, a second pressure sensing signal from the second pressure sensing unit and a third pressure sensing signal from the third pressure sensing unit.

The panel driving unit may display a warning message or a warning symbol on a display area of the flexible display panel, according to the third pressure sensing signal.

The flexible display panel may include a substrate on the panel support portion; a pixel electrode on the substrate; a common electrode on the pixel electrode; a light emitting element layer between the pixel electrode and the common electrode; a pixel defining layer overlapping a portion of the pixel electrode to define a pixel area; and a sealing member on the pixel defining layer and the pixel area.

The flexible display panel may further include a first spacer between the pixel defining layer and the sealing member, the first spacer positioned corresponding to the third pressure sensing unit.

The third pressure sensing unit may include a first electrode on the sealing member, the first electrode positioned corresponding to the pixel defining layer; a second electrode on the first electrode; and an elastic element between the first electrode and the second electrode.

The display device may further include a second spacer between the sealing member and the first electrode.

The second spacer may have a greater thickness than a thickness of an insulating layer except another insulating layer that is most adjacent to the first spacer, among insulating layers of the sealing member between the first spacer and the second spacer.

The display device may further include a buffer layer on the sealing member.

The second spacer may have a modulus less than a modulus of the buffer layer.

The buffer layer may have a thickness less than a thickness of the second spacer.

The buffer layer may be further disposed between the second spacer and the first electrode.

The buffer layer positioned corresponding to the pixel area may have a greater thickness than the thickness of the second spacer.

The second spacer may have an arch-shaped or parabolic cross-section convexly protruding toward the first electrode.

A length of a first side of the second spacer facing the sealing member may be substantially equal to or different from a length of a second side of the second spacer facing the first electrode.

The length of the first side may be longer than the length of the second side.

The display device may further include at least one second spacer on the sealing member. A length of a first side of the at least one second spacer facing the sealing member may be less than a length of a second side of the at least one second spacer facing the first electrode.

The second sides of adjacent ones of the second spacers may be connected to each other, and the display device may further include an air layer positioned in a space defined by the adjacent second spacers and the sealing member.

The display device may further include a second spacer on the sealing member. The second spacer may have an arch shape or a parabolic shape protruding convexly in a direction opposite to the sealing member positioned in a pixel area.

The display device may further include an air layer positioned in a space defined by the second spacer and the sealing member.

The foregoing is illustrative only and is not intended to be in any way limiting. In addition to the illustrative aspects, exemplary embodiments and features described above, further aspects, exemplary embodiments and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Figure 1:
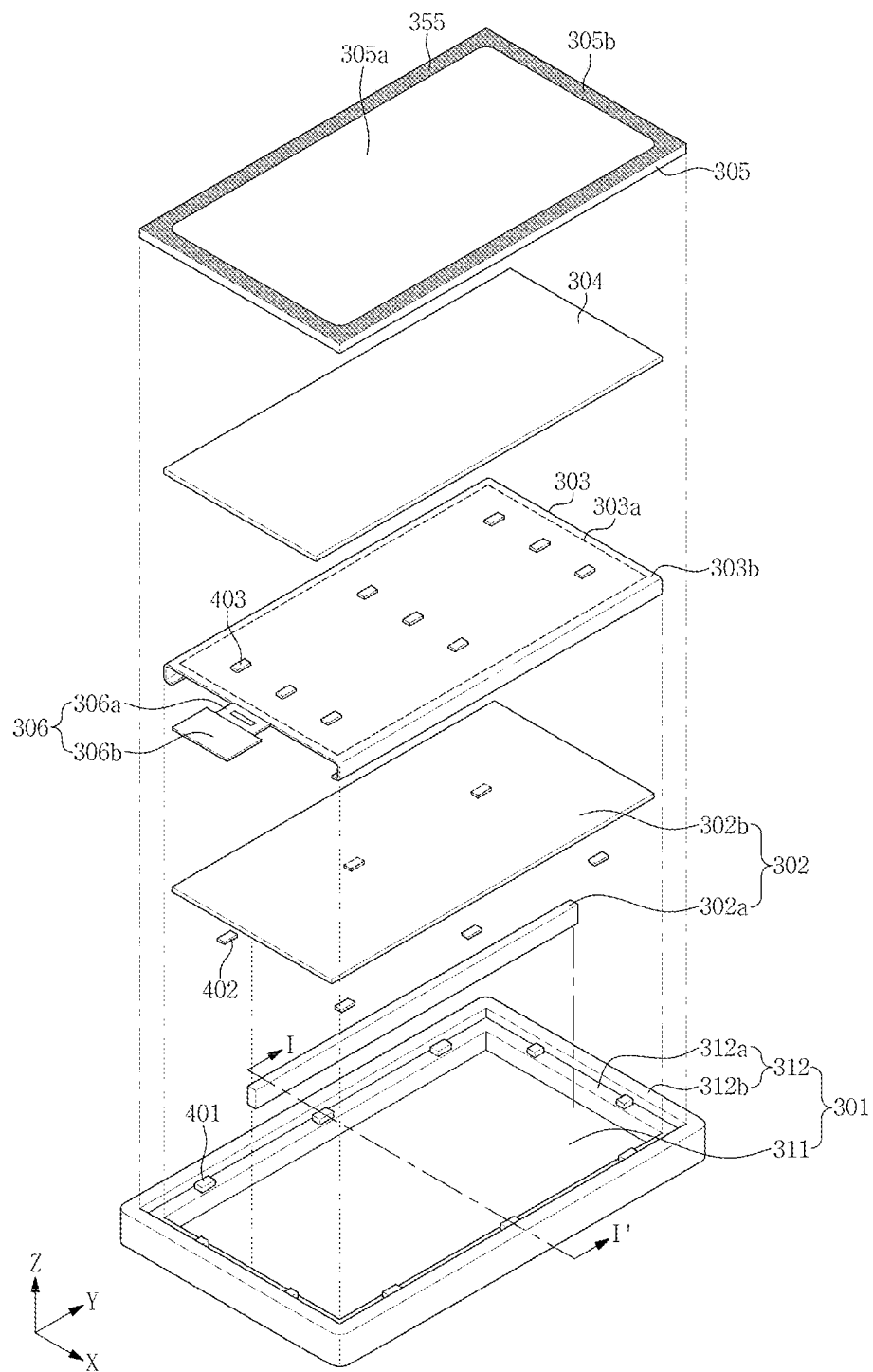
FIG. 1 is an exploded perspective view illustrating a display device according to an exemplary embodiment.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present inventive concept and like reference numerals refer to like elements throughout the specification.

Hereinafter, a display device according to an exemplary embodiment will be described in detail with reference to FIGS. 1 to 15.

Figure 2:
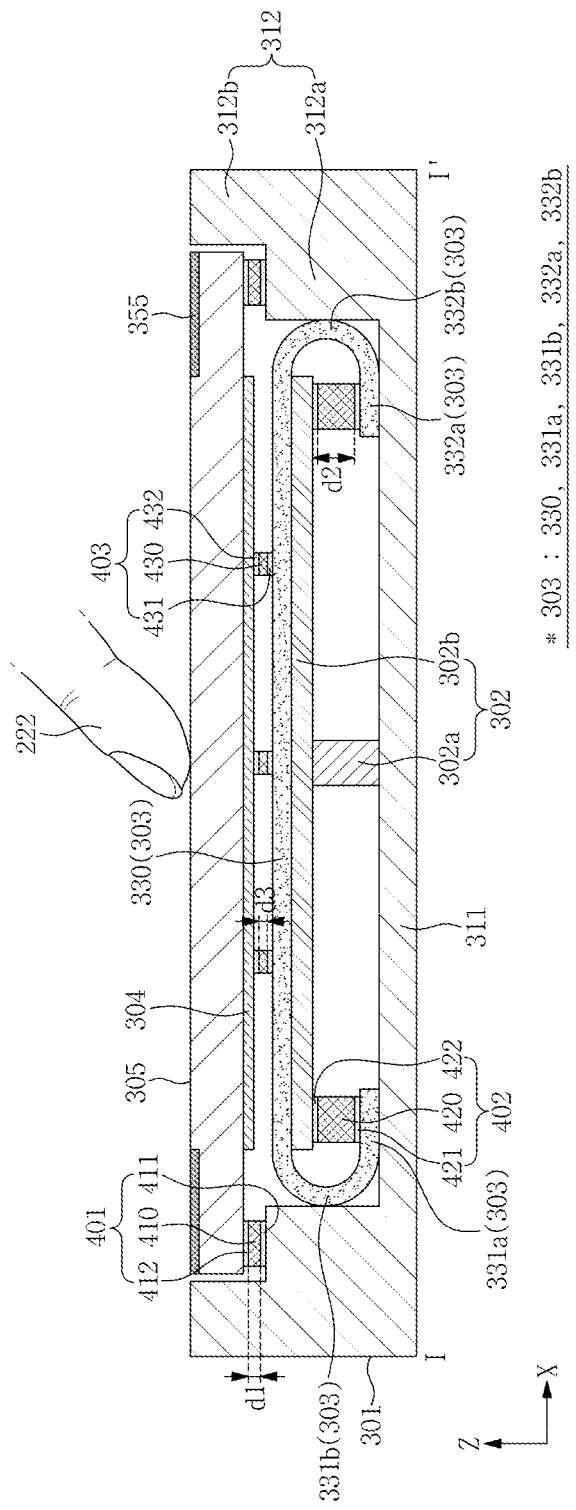
FIG. 2 is a cross-sectional view taken along line I-I' of FIG. 1.

FIG. 1 is an exploded perspective view illustrating a display device according to an exemplary embodiment, and FIG. 2 is a cross-sectional view taken along line I-I' of FIG. 1. FIG. 2 shows a state in which all the components of the display device of FIG. 1 are combined with each other.

As illustrated in FIGS. 1 and 2, the display device according to an exemplary embodiment includes a frame 301, a panel support portion 302, a display panel 303, a sensing unit 304, a window 305, a first pressure sensing unit 401, a second pressure sensing unit 402 and a third pressure sensing unit 403.

As illustrated in FIGS. 1 and 2, the frame 301 may include a base portion 311 and a side portion 312.

The base portion 311 of the frame 301 may have a quadrangular plate shape, as in one example illustrated in FIG. 1.

The side portion 312 of the frame 301 may have a shape of a quadrangular ring or a quadrangular closed loop, as in one example illustrated in FIG. 1. The side portion 312 has a shape protruding from an edge of the base portion 311. The side portion 312 may protrude at an angle of about 90 degrees with respect to a surface of the base portion 311. For example, the side portion 312 may protrude in a direction parallel to a Z-axis (hereinafter, "a Z-axis direction"). As illustrated in FIGS. 1 and 2, the base portion 311 and the side portion 312 may be integrally formed (e.g., into a monolithic structure).

As illustrated in FIG. 2, the side portion 312 may have a step-shaped cross-section. For example, the side portion 312 may include an inner side portion 312a and an outer side portion 312b having different heights.

Each of the inner side portion 312a and the outer side portion 312b may have a shape of a quadrangular ring or a quadrangular closed loop. The outer side portion 312b surrounds the inner side portion 312a. The outer side portion 312b has a greater height than a height of the inner side portion 312a. Herein, the respective heights of the inner side portion 312a and the outer side portion 312b mean the height in the Z-axis direction. In other words, the height of the outer side portion 312b measured in the Z-axis direction with respect to the base portion 311 is higher than the height of the inner side portion 312a measured in the Z-axis direction with respect to the base portion 311. The inner side portion 312a and the outer side portion 312b may be integrally formed (e.g., into a monolithic structure).

In an exemplary embodiment, although not illustrated, the side portion 312 may not include the outer side portion 312b.

In such an exemplary embodiment, a portion of the base portion 311 positioned corresponding to the outer side portion 312b may be removed.

As illustrated in FIG. 2, the panel support portion 302 is positioned between the base portion 311 of the frame 301 and the window 305. The panel support portion 302 is placed in a space (hereinafter, "an accommodation space") defined by being surrounded by the base portion 311 of the frame 301, the inside portion 312a and the window 305.

As illustrated in FIGS. 1 and 2, the panel support portion 302 may include a support 302a and a support plate 302b.

The support 302a is positioned between the support plate 302b and the base portion 311 of the frame 301. For example, the support 302a may be positioned between a central portion of the support plate 302b and a central portion of the base portion 311. The support 302a may have a bar shape, as illustrated in FIG. 1. Such a bar-shaped support 302a may be positioned parallel to two opposing sides of four sides of the side portion 312. For example, as illustrated in FIG. 1, the support 302a may be parallel to two opposing sides that have relatively longer lengths of the four sides of the side portion 312. Each of the two sides means a side arranged in a direction parallel to a Y-axis (hereinafter, "a Y-axis direction").

The support 302a fastens the support plate 302b to the frame 301. To this end, one end portion of the support 302a is fastened to the support plate 302b and another end portion of the support 302a is fastened to the base portion 311 of the frame 301.

The support 302a may include an elastic material. Accordingly, when the window 305 is pressed by a finger 222 or the like in the Z-axis direction or in a direction close to the Z-axis direction, the support 302a may be compressed in accordance with the pressing force. However, when the force is removed, the support 302a is restored to its original shape.

The support plate 302b has a quadrangular plate shape. The support plate 302b has a smaller area than an area of the aforementioned base portion 311. As illustrated in FIGS. 1 and 2, the support plate 302b is surrounded by the inner side portion 312a. In other words, the inner side portion 312a surrounds the support plate 302b at a position a predetermined distance apart from the support plate 302b. The support plate 302b faces a side surface of the inner side portion 312a. The side surface of the inner side portion 312a may be a surface parallel to a plane defined by the Y axis and the Z axis (hereinafter, "a YZ plane") or a surface parallel to a plane defined by an X axis and the Z axis (hereinafter, "an XZ plane").

In an exemplary embodiment, although not illustrated, the support plate 302b and the support 302a may include a substantially same material, for example, an elastic material. For example, the support plate 302b and the support 302a may include a form tape.

The display panel 303 displays an image. Although not illustrated, the display panel 303 includes a plurality of pixels for displaying an image. The display panel 303 has a display area 303a and a non-display area 303b and the pixels are positioned in the display area 303a of the display panel 303.

As illustrated in FIG. 2, the display panel 303 is positioned in the aforementioned accommodation space. The display panel 303 is a flexible display panel 303 that may be bent. Hereinafter, the display panel 303 refers to a flexible display panel 303, unless described otherwise.

As illustrated in FIG. 2, a portion 330 (hereinafter, "a central portion") of the display panel 303 is supported by the panel support portion 302. The central portion 330 of the display panel 303 may be positioned between the support plate 302b and the window 305.

Another portion 331a (hereinafter, "a first edge portion") of the display panel 303 is positioned between the support plate 302b and the base portion 311 as illustrated in FIG. 2. In more detail, the first edge portion 331a may be positioned between one edge of the support plate 302b and the base portion 311.

Further, another portion 331b (hereinafter, "a first curved portion") of the display panel 303 has a curved shape. The first curved portion 331b passes through a gap between said one edge of the support plate 302b and the inner side portion 312a. The first curved portion 331b faces a side surface of the inner side portion 312a. The first curved portion 331b is connected between the central portion 330 and the first edge portion 331a.

Further, another portion 332a (hereinafter, "a second edge portion") of the display panel 303 is positioned between the support plate 302b and the base portion 311, as illustrated in FIG. 2. For example, the second edge portion 332a is positioned between another edge of the support plate 302b and the base portion 311.

Further, another portion 332b (hereinafter, "a second curved portion") of the display panel 303 has a curved shape. The second curved portion 332b passes through a gap between said another edge of the support plate 302b and the inner side portion 312a. The second curved portion 332b faces another side surface of the inner side portion 312a. The second curved portion 332b is connected between the central portion 330 and the second edge portion 332a.

The central portion 330, the first curved portion 331b, the first edge portion 331a, the second curved portion 332b and the second edge portion 332a of the display panel 303 are integrally formed (e.g., into a monolithic structure).

The window 305 faces at least a portion of the frame 301. For example, the window 305 may face the side portion 312 of the frame 301. As a more specific example, as illustrated in FIG. 2, an edge of the window 305 faces an upper surface of the inner side portion 312a. The upper surface of the inner side portion 312a is a surface parallel to a plane defined by the X axis and the Y axis (hereinafter, "an XY plane").

The window 305 has a light transmitting area 305a and a light blocking area 305b. The light transmitting area 305a of the window 305 is positioned corresponding to the display area 303a of the display panel 303.

The light blocking area 305b of the window 305 is positioned at an edge of the window 305. For example, the light blocking area 305b may have a ring shape surrounding the light transmitting area 305a. A light blocking member 355 may be positioned in the light blocking area 305b of the window 305. The window 305 may include a glass material.

The sensing unit 304 may be positioned between the display panel 303 and the window 305, as illustrated in FIG. 2. The sensing unit 304 may include at least one third pressure sensing unit 403, as illustrated in FIGS. 1 and 2. In an exemplary embodiment, although not illustrated, the sensing unit 304 may further include at least one touch sensing unit.

The first pressure sensing unit 401 is positioned between the window 305 and the frame 301. For example, the first pressure sensing unit 401 may be positioned between an edge of the window 305 and the inner side portion 312a, as illustrated in FIG. 2. For example, the first pressure sensing unit 401 may be positioned between an edge of the window 305 and the upper surface of the inner side portion 312a.

When the window 305 is pressed in the Z-axis direction or in a direction close to the Z-axis direction by the finger 222 or the like, as illustrated in FIG. 2, the first pressure sensing unit 401 senses the pressing force, that is, the pressure. The first pressure sensing unit 401 generates a sensing signal as a result of the sensing and transmits the sensing signal to a panel driving unit 306.

The panel driving unit 306 may include a flexible printed circuit board 306a such as a chip on film (COF) and a printed circuit board 306b connected to the flexible printed circuit board 306a. As illustrated in FIG. 1, the panel driving unit 306 may be electrically connected to the non-display area 303b of the display panel 303.

The first pressure sensing unit 401 may be a capacitor including a first electrode 411, a second electrode 412 and an elastic element 410. The first electrode 411 and the second electrode 412 face each other with the elastic element 410 interposed therebetween. The first electrode 411 and the second electrode 412 correspond to one electrode and another electrode of the capacitor, respectively, and the elastic element 410 corresponds to a dielectric element of the capacitor.

When a thickness of the elastic element 410 changes due to the pressure applied to the first pressure sensing unit 401, a distance between the first electrode 411 and the second electrode 412 changes due to the changed thickness and a capacitance of the capacitor changes due to the changed thickness. The first pressure sensing unit 401 may output, as a sensing signal, a voltage across opposite ends of the capacitor which varies in accordance with the capacitance change of the capacitor.

The display device according to an exemplary embodiment may include the plurality of first pressure sensing units 401. In such an exemplary embodiment, the plurality of first pressure sensing units 401 may be at different positions of the upper surface of the inner side portion 312a, as illustrated in FIG. 1.

The second pressure sensing unit 402 is positioned at the panel support portion 302 and the first edge portion 331a of the display panel 303. For example, the second pressure sensing unit 402 may be positioned between the support plate 302b of the panel support portion 302 and the first edge portion 331a of the display panel 303, as illustrated in FIG. 2. Herein, when a portion of the display panel 303 at which the display area 303a is positioned is defined as a front surface of the display panel 303 and a surface of the display panel 303 opposite to the front surface is defined as a rear face of the display panel 303, the second pressure sensing unit 402 is positioned on the rear surface of the first edge portion 331a. The front surface of the display panel 303 includes a surface toward the window 305. The front surface of the display panel 303 at the first edge portion 331a faces the base portion 311 and the rear surface of the display panel 303 at the first edge portion 331a faces the second pressure sensing unit 402.

As illustrated in FIG. 2, when the window 305 is pressed in the Z-axis direction or in a direction close to the Z-axis direction by the finger 222 or the like, the pressure corresponding to the pressing force is transmitted to the sensing unit 304, the display panel 303 and the panel support portion 302 below the window 305. Then, the support 302a is compressed by the pressure and the support plate 302b is lowered toward the base portion 311. In such an exemplary embodiment, the support plate 302b presses the second pressure sensing unit 402 and the second pressure sensing unit 402 senses a pressure corresponding to the pressing force. The second pressure sensing unit 402 generates a sensing signal as a result of the sensing and transmits the sensing signal to the panel driving unit 306.

The second pressure sensing unit 402 may be a capacitor including a first electrode 421, a second electrode 422 and an elastic element 420. Since the second pressure sensing unit 402 has a substantially same structure as a structure of the first pressure sensing unit 401 described above, detailed descriptions of the second pressure sensing unit 402 will make reference to the descriptions of the first pressure sensing unit 401.

The display device according to an exemplary embodiment may include the plurality of second pressure sensing units 402. In such an exemplary embodiment, as illustrated in FIG. 1, the plurality of second pressure sensing units 402 may be at different positions of the first edge portion 331a and the second edge portion 332a.

The third pressure sensing unit 403 may be positioned between the display panel 303 and the window 305. For example, the third pressure sensing unit 403 may be positioned between the front surface of the display panel 303 and the light transmitting area 305a of the window 305. As a more specific example, the third pressure sensing unit 403 may be positioned between the display area 303a of the display panel 303 and the light transmitting area 305a of the window 305.

In an exemplary embodiment, in the case where the sensing unit 304 is positioned between the display panel 303 and the window 305, the third pressure sensing unit 403 may be positioned between the display panel 303 and the sensing unit 304. For example, the third pressure sensing unit 403 may be positioned between the front surface of the display panel 303 and the sensing unit 304. As a more specific example, the third pressure sensing unit 403 may be positioned between the display area 303a of the display panel 303 and the sensing unit 304.

In an exemplary embodiment, as described above, the third pressure sensing unit 403 may be positioned in the sensing unit 304, as illustrated in FIGS. 1 and 2.

When the window 305 is pressed in the Z-axis direction or in a direction close to the Z-axis direction by the finger 222 or the like, as illustrated in FIG. 2, a pressure corresponding to the pressing force is transmitted to the third pressure sensing unit 403 below the window 305. Accordingly, the third pressure sensing unit 403 senses the pressure. The third pressure sensing unit 403 generates a sensing signal as a result of the sensing and transmits the generated sensing signal to the panel driving unit 306.

The third pressure sensing unit 403 may be a capacitor including a first electrode 431, a second electrode 432 and an elastic element 430. Since the third pressure sensing unit 403 has a substantially same structure as a structure of the first pressure sensing unit 401 described above, detailed descriptions of the third pressure sensing unit 403 will make reference to the above description of the first pressure sensing unit 401.

The display device according to an exemplary embodiment may include the plurality of third pressure sensing units 403 and in such an exemplary embodiment, the plurality of third pressure sensing units 403 may be at different positions of the display area 303a included in the display panel 303.

Figure 3:
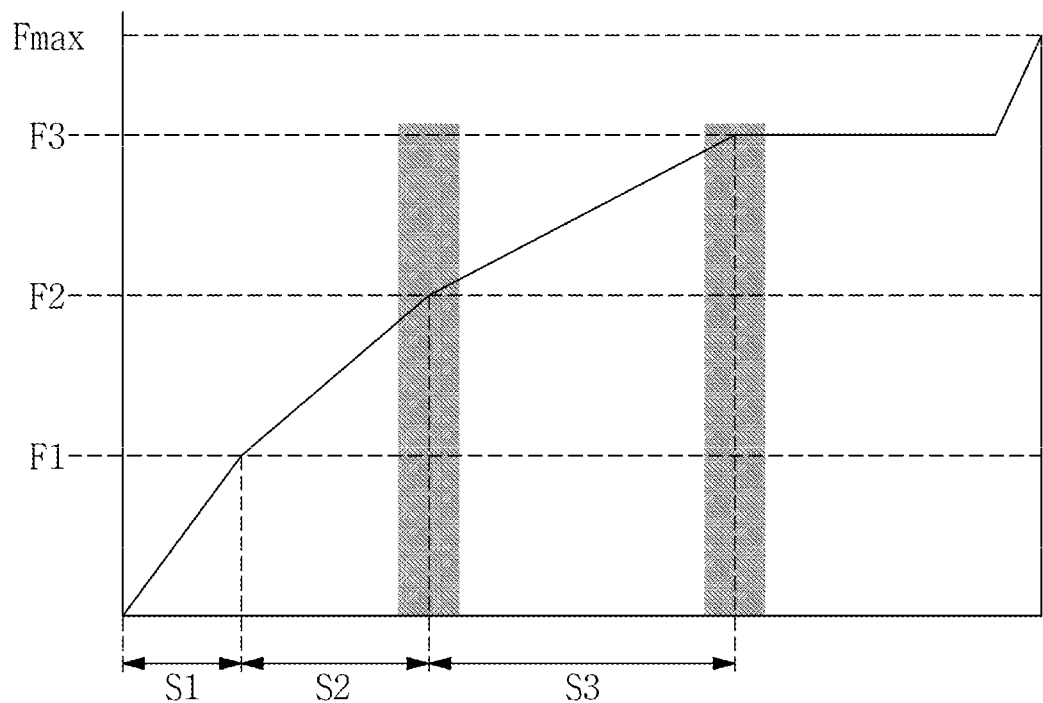
FIG. 3 is an explanatory view illustrating sensitivities of first, second and third pressure sensing units of FIG. 2.

FIG. 3 is an explanatory view illustrating sensitivities of the first, second and third pressure sensing units 401, 402 and 403 of FIG. 2.

The first pressure sensing unit 401, the second pressure sensing unit 402 and the third pressure sensing unit 403 may have different signal to noise ratios (hereinafter, "pressure sensitivity").

For example, among the first, second and third pressure sensing units 401, 402 and 403, the first pressure sensing unit 401 may have a highest pressure sensitivity and the third pressure sensing unit 403 may have a lowest pressure sensitivity. The second pressure sensing unit 402 may have a pressure sensitivity lower than that of the first pressure sensing unit 401 and higher than that of the third pressure sensing unit 403.

The first pressure sensing unit 401 operates in a first operation section S1, the second pressure sensing unit 402 operates in a second operation section S2 and the third pressure sensing unit 403 operates in a third operation section S3. For example, the first pressure sensing unit 401 outputs a sensing signal in a first operation section S1, the second pressure sensing unit 402 outputs a sensing signal in a second operation section S2 and the third pressure sensing unit 403 outputs a sensing signal in a third operation section S3.

Due to such a difference in pressure sensitivity, the first pressure sensing unit 401, the second pressure sensing unit 402 and the third pressure sensing unit 403 respond to forces of different levels. For example, the first pressure sensing unit 401 responds to a force equal to or greater than a smallest force F1 (hereinafter, "a first pressure"), the third pressure sensing unit 403 responds to a force equal to or greater than a greatest force F3 (hereinafter, "a third pressure") and the second pressure sensing unit 402 responds to a force equal to or greater than a force F2 (hereinafter, "a second pressure") having a level between the first pressure F1 and the third pressure F3.

Accordingly, when a pressure greater than or equal to the first pressure F1 and less than the second pressure F2 is applied in the Z-axis direction to the window 305 of the display device, the first pressure sensing unit 401 outputs a sensing signal while each of the second and third pressure sensing units 402 and 403 does not output a sensing signal.

In addition, when the pressure greater than or equal to the second pressure F2 and less than the third pressure F3 is applied in the Z-axis direction to the window 305 of the display device, each of the first and second pressure sensing units 401 and 402 outputs a sensing signal while the third pressure sensing unit 403 does not output a sensing signal.

In addition, when a pressure greater than or equal to the third pressure F3 is applied in the Z-axis direction to the window 305 of the display device, the first, second and third pressure sensing units 401, 402 and 403 output sensing signals, respectively.

In order to obtain such a sensitivity difference, the first, second and third pressure sensing units 401, 402 and 403 may have different levels of moduli (or elastic force). For example, the moduli of the elastic elements 410, 420 and 430 included in the first, second and third pressure sensing units 401, 402 and 403, respectively, have a magnitude relationship according to the following Equation 1.

$$\varepsilon 1 < \varepsilon 2 < \varepsilon 3 \qquad \text{<Equation 1>}$$

In Equation 1, ε1 designates a modulus (hereinafter, "a first modulus") of the elastic element 410 included in the first pressure sensing unit 401, ε2 designates a modulus (hereinafter, "a second modulus") of the elastic element 420 included in the second pressure sensing unit 402 and ε3 designates a modulus (hereinafter, "a third modulus") of the elastic element 430 included in the third pressure sensing unit 403.

The first modulus ε1 is the smallest among the first, second and third moduli ε1, ε2 and ε3 and the third modulus ε3 is the greatest thereamong. Further, the second modulus ε2 is greater than the first modulus ε1 and less than the third modulus ε3.

As such, the elastic element 410 of the first pressure sensing unit 401 has the smallest modulus ε1 and the elastic element 430 of the third pressure sensing unit 403 has the greatest modulus ε3. Further, the elastic element 420 of the second pressure sensing unit 402 has the modulus ε2 greater than the modulus ε1 of the elastic element 410 included in the first pressure sensing unit 401 and less than the modulus ε3 of the elastic element 430 included in the third pressure sensing unit 403. Accordingly, under a substantially same pressure, the elastic element 410 of the first pressure sensing unit 401 may be relatively easily deformed, while the elastic element 430 of the third pressure sensing unit 403 may not be easily deformed.

As described above, the first, second and third pressure sensing units 401, 402 and 403 have different sensitivities. Accordingly, when the pressure applied to the window 305 gradually increases, the first pressure sensing unit 401 operates first, the second pressure sensing unit 402 operates thereafter, and then the third pressure sensing unit 403 operates.

The elastic members 410, 420 and 430 included in the first, second and third pressure sensing units 401, 402 and 403 may have different thicknesses, respectively. For example, the thicknesses of the elastic members 410, 420 and 430 included in the first, second and third pressure sensing units 401, 402 and 403 have a relationship according to the following Equation 2.

$$d1 \leq d2 \gg d3 \text{ (or } d1 \leq d2 \text{ and } d3 \ll d2\text{)} \qquad \text{<Equation 2>}$$

In Equation 2, d1 designates a thickness (hereinafter, a first thickness) of the elastic element 410 included in the first pressure sensing unit 401, d2 designates a thickness (hereinafter, a second thickness) of the elastic element 420 included in the second pressure sensing unit 402, and d3 designates a thickness (hereinafter, a third thickness) of the elastic element 430 included in the third pressure sensing unit 403.

The second thickness d2 is greater than or equal to the first thickness d1 and the third thickness d3 is less than the second thickness d2. In such an exemplary embodiment, the third thickness d3 is considerably less than the second thickness d2.

When the pressure applied to the window 305 gradually increases, because of the difference in modulus and thickness between the elastic elements described above, the elastic element 410 of the first pressure sensing unit 401 is firstly compressed to the maximum, the elastic element 420 of the second pressure sensing unit 402 is compressed to the maximum thereafter, and then, the elastic element 430 of the third pressure sensing unit 403 is compressed to the maximum.

The thickness of the elastic element determines an overall thickness of the pressure sensing unit including the elastic element. In other words, the smaller the thickness of the elastic element, the smaller the overall thickness of the pressure sensing unit. On the other hand, as the thickness of the elastic element decreases, the probability of occurrence of detection error (or detection noise) may increase. Accordingly, a detection error may occur from the third pressure sensing unit 403 and the first pressure sensing unit 401 including the elastic element having a relatively small thickness. However, since the second pressure sensing unit 402 including the elastic element 420 that has a relatively large thickness operates together with the third pressure sensing unit 403 and the first pressure sensing unit 401, such a sensing error may be substantially minimized.

In addition, since the first pressure sensing unit 401 and the third pressure sensing unit 403, which relatively largely affect the overall thickness of the display device, include the elastic elements having relatively small thicknesses, while the second pressure sensing unit 402, which does not relatively largely affect the overall thickness of the display device, includes the elastic element 420 having a relatively large thickness, the sensing error may be substantially minimized and the display device may achieve slimness.

At room temperature, for example, the elastic element 410 of the first pressure sensing unit 401 may have a modulus ranging from about 0.01 MPa to about 3,000 MPa, the elastic element 420 of the second pressure sensing unit 402 may have a modulus ranging from about 0.01 MPa to about 5,000 MPa, and the elastic element 430 of the third pressure sensing unit 403 may have a modulus ranging from about 0.01 MPa to about 8,000 MPa. As a more specific example, the elastic element 410 of the first pressure sensing unit 401 may have a modulus ranging from about 0.1 MPa to about 3,000 MPa, the elastic element 420 of the second pressure sensing unit 402 may have a modulus ranging from about 3,000 MPa to about 5,000 MPa, and the elastic element 430 of the third pressure sensing unit 403 may have a modulus ranging from about 5,000 MPa to about 8,000 MPa.

The elastic element 410 of the first pressure sensing unit 401 may include one of polyimide, an acrylic-based material, a urethane-based material, a Si-rubber-based material, a synthetic rubber and a synthetic resin. Alternatively, the elastic element 410 of the first pressure sensing unit 401 may have the form of a foamed film (or a porous film) including one of a synthetic rubber and a synthetic resin. Herein, the synthetic rubber may include a material such as a nitrolic material or an acrylic material. In addition, the synthetic resin may include a thermoplastic elastomer based on polyolefin or polyester, and an ethylene-vinyl acetate copolymer, for example. In addition, the synthetic resin may include a material having rubber elasticity such as polyurethane, polybutadiene or soft polyvinyl chloride. In addition, the synthetic resin may include a compound of a material having rubber elasticity such as polyurethane, polybutadiene or soft polyvinyl chloride combined with a compounding agent including at least one of a hard polymer, a plasticizer and a softener.

Each of the elastic element 420 of the second pressure sensing unit 402 and the elastic element 430 of the third pressure sensing unit 403 may include a substantially same material as a material included in the elastic element 410 of the first pressure sensing unit 401.

The panel driving unit 306 controls the operation of the display panel 303 based on the pressure sensing signal from the first pressure sensing unit 401, the pressure sensing signal from the second pressure sensing unit 402, and the pressure sensing signal from the third pressure sensing unit 403. For example, the panel driving unit 306 may display a warning message, a warning symbol, or the like on the display area of the display panel 303 according to the pressure sensing signal from the third pressure sensing unit 403. That is, when the display panel 303 is pressed or folded with a force greater than a predetermined force, the panel driving unit 306 may display the warning message or the warning symbol to prevent the display panel 303 from being damaged.

Figure 4:
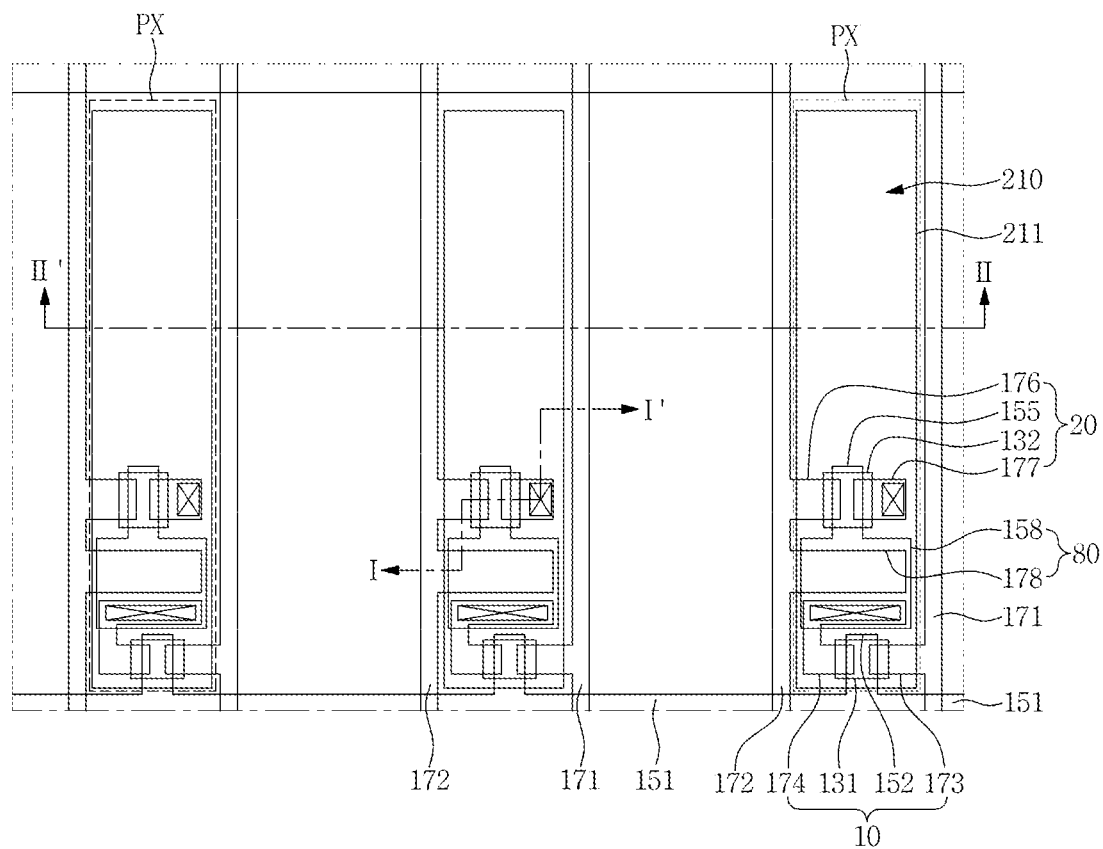
FIG. 4 is a view illustrating the detailed configuration of a display panel of FIG. 1.
Figure 5:
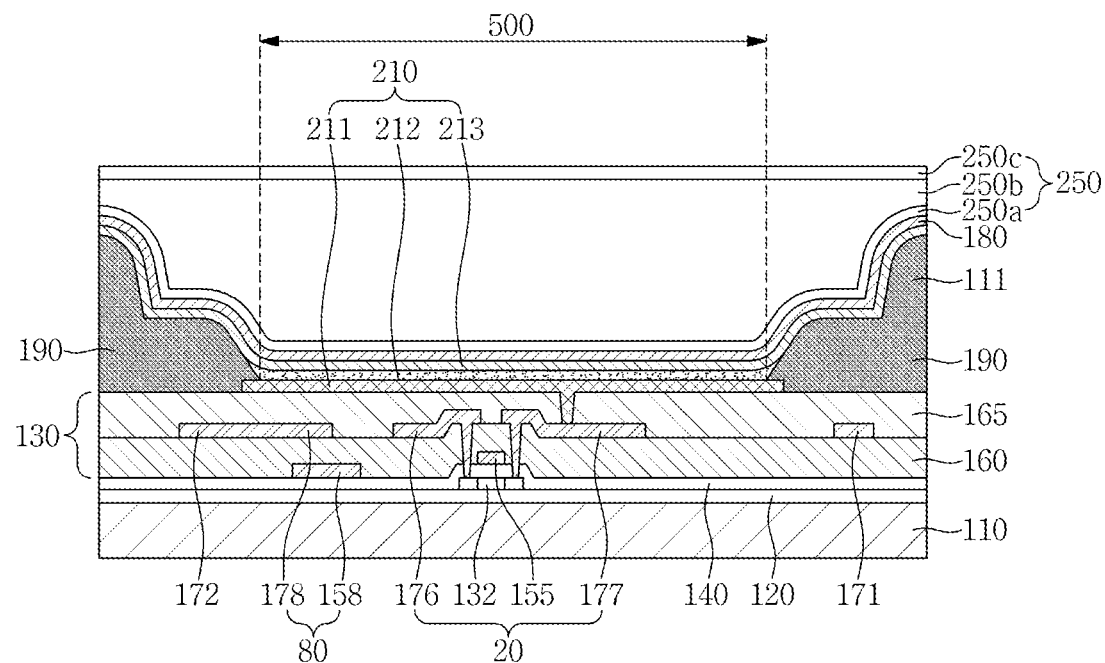
FIG. 5 is a cross-sectional view taken along line I-I' of FIG. 4.
Figure 6:
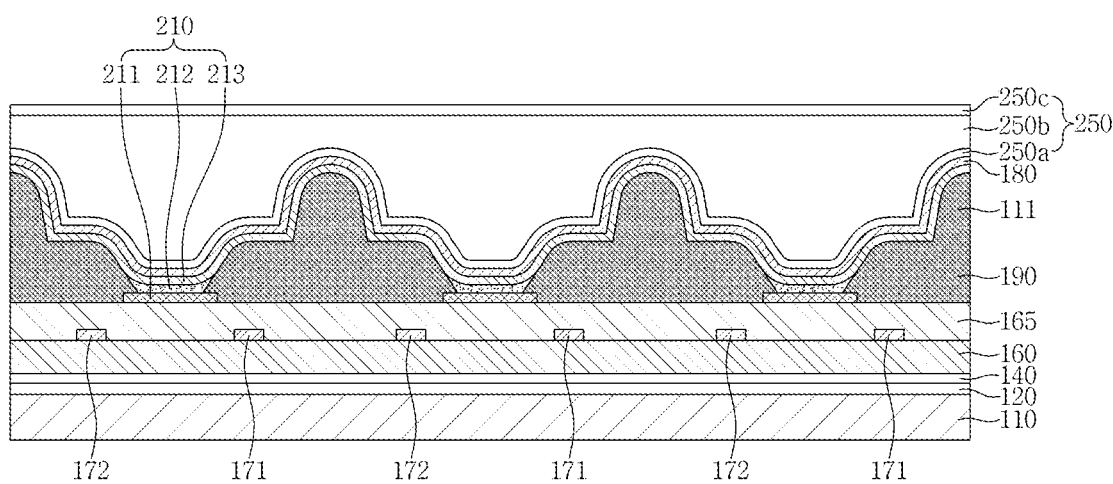
FIG. 6 is a cross-sectional view taken along line II-II' of FIG. 4.

FIG. 4 is a view illustrating a detailed configuration of the display panel 303 of FIG. 1, FIG. 5 is a cross-sectional view taken along line I-I' of FIG. 4, and FIG. 6 is a cross-sectional view taken along line II-II' of FIG. 4.

Referring to FIGS. 4, 5 and 6, the display panel 303 includes a substrate 110, a driving circuit unit 130 on the substrate 110, an organic light emitting diode ("OLED") 210 on the driving circuit unit 130 and a sealing member 250 on the OLED 210.

Each pixel PX may be positioned in an area defined by a gate line 151, a data line 171 and a common power line 172.

Figure 11:
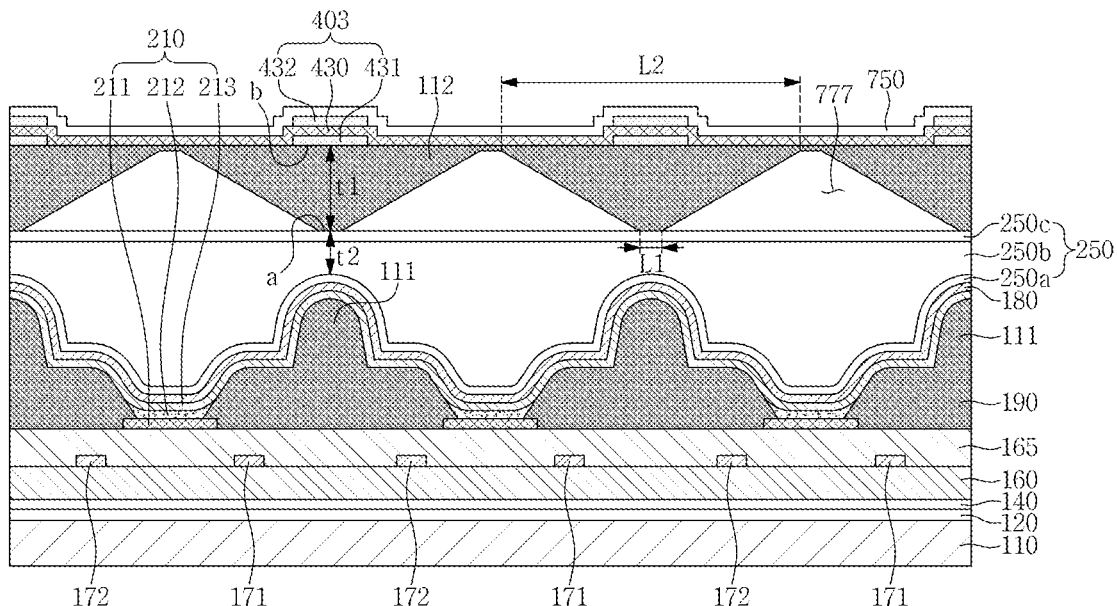
FIG. 11 is still yet another view illustrating a configuration of a third pressure sensing unit and a peripheral portion thereof.

As illustrated in FIG. 11, adjacent pixels PX are spaced apart from each other by a predetermined distance. For example, a distance between the common power line 172 connected to one pixel (hereinafter, "a first pixel") and the data line 171 connected to another pixel (hereinafter, "a second pixel") adjacent to the first pixel is longer than a distance between the data line 171 that defines the position of the first pixel and the common power line 172. This is to substantially prevent a material used for the OLED 210 from being penetrated into the second pixel, when the OLED 210 is deposited in the first pixel by a mask deposition process.

The driving circuit unit 130 for driving the OLED 210 is provided on the substrate 110. The driving circuit unit 130 includes a switching thin film transistor ("TFT") 10, a driving TFT 20 and a capacitor 80, and the driving circuit unit 130 drives a light emitting layer 212 of the OLED 210.

The detailed structure of the driving circuit unit 130 and the OLED 210 is shown in FIGS. 4 and 5, but exemplary embodiments are not limited to the structures illustrated in FIGS. 4 and 5. The driving circuit unit 130 and the OLED 210 may be formed in various structures within a range that may be easily modified by those skilled in the art.

Referring to FIG. 4, one pixel PX is depicted as including two TFTs and one capacitor. However, exemplary embodiments are not limited thereto, and each pixel PX may include three or more TFTs and two or more capacitors and may have a variety of structures including additional signal lines. Herein, the term "pixel" refers to a smallest unit for displaying an image and may be any one of a red pixel for emitting red light, a green pixel for emitting green light and a blue pixel for emitting blue light. For example, as illustrated in FIG. 6, a pixel including a leftmost OLED may be a red pixel, a pixel including a central OLED may be a green pixel and a pixel including a rightmost OLED may be a blue pixel. To this end, the leftmost OLED may be a red OLED, the central OLED may be a green OLED and the rightmost OLED may be a blue OLED.

Referring to FIGS. 4 and 5, each pixel PX includes the switching TFT 10, the driving TFT 20, the capacitor 80 and the OLED 210. Herein, the structure including the switching TFT 10, the driving TFT 20 and the capacitor 80 is referred to as a driving circuit unit 130.

The driving circuit unit 130 includes the gate line 151 disposed along one direction and the data line 171 and the common power line 172 insulated from and intersecting the gate line 151.

The substrate 110 may be a transparent insulating substrate 110 including glass or transparent plastic. For example, the substrate 110 may include one selected from the group consisting of: kapton, polyethersulphone (PES), polycarbonate (PC), polyimide (PI), polyethyleneterephthalate (PET), polyethylene naphthalate (PEN), polyacrylate (PAR), fiber reinforced plastic (FRP) and the like.

A first buffer layer 120 may be disposed on the substrate 110. The first buffer layer 120 serves to prevent permeation of undesirable elements and to planarize a surface therebelow, and may include suitable materials for planarizing and/or preventing permeation. For example, the first buffer layer 120 may include one of the followings: a silicon nitride ($SiN_x$) layer, a silicon oxide ($SiO_2$) layer and a silicon oxynitride ($SiO_xN_y$) layer. However, the first buffer layer 120 is not invariably necessary and may be omitted based on the kinds of the substrate 110 and process conditions thereof.

A switching semiconductor layer 131 and a driving semiconductor layer 132 are disposed on the first buffer layer 120. The switching semiconductor layer 131 and the driving semiconductor layer 132 may include at least one of the followings: a polycrystalline silicon layer, an amorphous silicon layer and an oxide semiconductor including, for example, indium galuim zinc oxide (IGZO) and indium zinc tin oxide (IZTO). For example, in the case where the driving semiconductor layer 132 illustrated in FIG. 5 includes a polycrystalline silicon layer, the driving semiconductor layer 132 includes a channel area that is not doped with impurities and p+ doped source and drain areas that are formed on opposite sides of the channel area. In such an exemplary embodiment, p-type impurities, such as boron B, may be used as dopant ions and $B_2H_6$ is typically used. Such impurities may vary depending on the kinds of TFTs.

The driving TFT 20 according to an exemplary embodiment uses a p-channel metal oxide semiconductor (PMOS) TFT including p-type impurities, but exemplary embodiments are not limited thereto. Alternatively, the driving TFT 20 may use an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include at least one of: tetraethylorthosilicate (TEOS), silicon nitride ($SiN_x$) and silicon oxide ($SiO_2$). For example, the gate insulating layer 140 may have a double-layer structure where a $SiN_x$ layer having a thickness of about 40 nm and a TEOS layer having a thickness of about 80 nm are sequentially stacked.

A gate transmission line including gate electrodes 152 and 155 is disposed on the gate insulating layer 140. The gate transmission line further includes the gate line 151, a first capacitor plate 158 and other signal lines. In addition, the gate electrodes 152 and 155 are disposed to overlap at least a portion of or the entirety of the semiconductor layers 131 and 132, for example, a channel area thereof. The gate electrodes 152 and 155 serve to substantially prevent the channel area from being doped with impurities when a source area and a drain area of the semiconductor layers 131 and 132 are doped with impurities during the process of forming the semiconductor layers 131 and 132.

The gate electrodes 152 and 155 and the first capacitor plate 158 are disposed on a substantially same layer and include a substantially same metal material. The gate electrodes 152 and 155 and the first capacitor plate 158 may include at least one of molybdenum (Mo), chromium (Cr) and tungsten (W).

An insulating interlayer 160 overlapping the gate electrodes 152 and 155 is disposed on the gate insulating layer 140. The insulating interlayer 160, similar to the gate insulating layer 140, may include or be formed of silicon nitride (SiNx), silicon oxide (SiOx), tetraethoxysilane (TEOS) or the like, but exemplary embodiments are not limited thereto.

A data transmission line including source electrodes 173 and 176 and drain electrodes 174 and 177 is disposed on the insulating interlayer 160. The data transmission line further includes the data line 171, the common power line 172, a second capacitor plate 178 and other signal lines. In addition, the source electrodes 173 and 176 and the drain electrodes 174 and 177 are connected to the source area and the drain area of the semiconductor layers 131 and 132, respectively, through a contact hole defined in the gate insulating layer 140 and the insulating interlayer 160.

As such, the switching TFT 10 includes the switching semiconductor layer 131, the switching gate electrode 152, the switching source electrode 173 and the switching drain electrode 174 and the driving TFT 20 includes the driving semiconductor layer 132, the driving gate electrode 155, the driving source electrode 176 and the driving drain electrode 177. Configurations of the TFTs 10 and 20 are not limited to the above embodiments and thus may be modified into various structures that are known to and may be easily conceived by those skilled in the pertinent art.

The capacitor 80 includes the first capacitor plate 158 and the second capacitor plate 178, having the insulating interlayer 160 interposed therebetween.

The switching TFT 10 is used as a switching element to select pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving TFT 20 applies, to a pixel electrode 211, a driving power which allows a light emitting layer 212 of the OLED 210 in the selected pixel to emit light. The driving gate electrode 155 is connected to the first capacitor plate 158. The driving source electrode 176 and the second capacitor plate 178 each are connected to the common power line 172. The driving drain electrode 177 is connected to the pixel electrode 211 of the OLED 210 through a contact hole.

With the aforementioned structure, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80 and a current corresponding to the voltage stored in the capacitor 80 flows to the OLED 210 through the driving TFT 20, such that the OLED 210 may emit light.

A planarization layer 165 is disposed to cover the data transmission line, e.g., the data line 171, the common power line 172, the source electrodes 173 and 176, the drain electrodes 174 and 177 and the second capacitor plate 178, which are patterned using a substantially same mask. The planarization layer 165 is disposed on the insulating interlayer 160.

The planarization layer 165 serves to substantially eliminate a step difference and planarize a surface therebelow so as to increase luminance efficiency of the OLED 210 to be formed thereon. The planarization layer 165 may include at least one of the following materials: a polyacrylate resin, an epoxy resin, a phenolic resin, a polyamide resin, a polyimide resin, an unsaturated polyester resin, a polyphenylen ether resin, a polyphenylene sulfide resin and benzocyclobutene (BCB).

The pixel electrode 211 of the OLED 210 is disposed on the planarization layer 165. The pixel electrode 211 is connected to the drain electrode 177 through a contact hole defined in the planarization layer 165.

A part of or the entirety of the pixel electrode 211 is disposed in a pixel area 500. That is, the pixel electrode 211 is arranged to correspond to the pixel area 500 defined by a pixel defining layer 190. The pixel defining layer 190 may include a resin such as a polyacrylate resin and a polyimide resin.

A first spacer 111 is positioned on the pixel defining layer 190. The first spacer 111 may include a substantially same material as a material included in the pixel defining layer 190. The first spacer 111 serves to substantially minimize a height difference between a layer positioned in the display area 303a of the display panel 303 and a layer positioned in the non-display area 303b of the display panel 303. The first spacer 111 may be positioned corresponding to the third pressure sensing unit 403.

The light emitting layer 212 is disposed on the pixel electrode 211 in the pixel area 500 and the common electrode 213 is disposed on the pixel defining layers 190, the first spacer 111 and the light emitting layer 212.

The light emitting layer 212 includes a low molecular organic material or a high molecular organic material. At least one of a hole injection layer HIL and a hole transporting layer HTL may further be disposed between the pixel electrode 211 and the light emitting layer 212 and at least one of an electron transporting layer ETL and an electron injection layer EIL may further be disposed between the light emitting layer 212 and the common electrode 213.

The pixel electrode 211 and the common electrode 213 may be formed as one of a transmissive electrode, a transflective electrode and a reflective electrode.

Transparent conductive oxide ("TCO") may be used to form a transmissive electrode. Such TCO may include at least one selected from the group consisting of: indium tin oxide (ITO), indium zinc oxide (IZO), antimony tin oxide (ATO), aluminum zinc oxide (AZO), zinc oxide (ZnO), and mixtures thereof.

A metal, e.g., magnesium (Mg), silver (Ag), gold (Au), calcium (Ca), lithium (Li), chromium (Cr), aluminum (Al), copper (Cu), or an alloy thereof may be used to form a transflective electrode and a reflective electrode. In such an exemplary embodiment, whether an electrode is a transflective type or a reflective type depends on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The pixel PX may have a structure of a double-sided emission type capable of emitting light in the direction of the pixel electrode 211 and the direction of the common electrode 213. In such an exemplary embodiment, both the pixel electrode 211 and the common electrode 213 may be formed as a transmissive electrode or a transflective electrode.

The sealing member 250 is disposed on the common electrode 213. The sealing member 250 may use a transparent insulating substrate 110 including glass or transparent plastic. Further, the sealing member 250 may have a thin film encapsulation structure including one or more inorganic layers and one or more organic layers that are alternately stacked. For example, as illustrated in FIG. 5, the sealing member 250 may include a first inorganic layer 250a, an organic layer 250b on the first inorganic layer 250a and a second organic layer 250c on the organic layer 250b.

In an exemplary embodiment, as illustrated in FIG. 5, a capping layer 180 may be further disposed between the sealing member 250 and the common electrode 213. The capping layer 180 serves to substantially prevent damage to the common electrode 213 positioned below the sealing member 250 when the sealing member 250 is deposited. The capping layer 180 may include an inorganic material.

Figure 7:
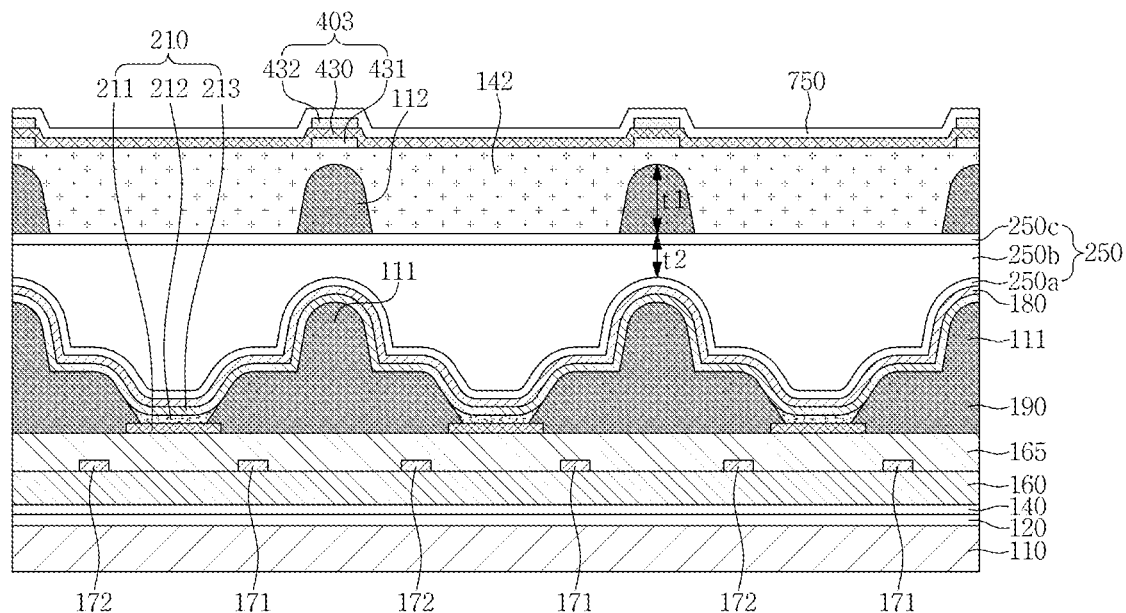
FIG. 7 is a view illustrating a configuration of a third pressure sensing unit and a peripheral portion thereof.

FIG. 7 is a view illustrating a configuration of the third pressure sensing unit 403 and a peripheral portion thereof.

The third pressure sensing unit 403 includes the first electrode 431, the second electrode 432 and the elastic element 430 as illustrated in FIG. 7.

The first electrode 431 is positioned on the sealing member 250 corresponding to the pixel defining layer 190. The first electrode 431 may include a metal.

The second electrode 432 is positioned on the first electrode 431. The second electrode 432 may include a metal.

The elastic element 430 is positioned between the first electrode 431 and the second electrode 432. The elastic element 430 may include a resin. The elastic element 430 may further be positioned on a second buffer layer 142 to be described below. In such an exemplary embodiment, the elastic elements 430 of the plurality of third pressure sensing units 403 may be integrally formed (e.g., in a monolithic structure). In other words, the plurality of third pressure sensing units 403 may share one elastic element 430. In an exemplary embodiment, although not illustrated, the elastic elements 430 of the third pressure sensing units 403 may not be connected to each other.

In an exemplary embodiment, the third pressure sensing unit 403 may further include a protective layer 750. The protective layer 750 is disposed on the second electrode 432 and the elastic element 430. In an exemplary embodiment, although not illustrated, the protective layers 750 of the respective third pressure sensing units 403 may not be connected to each other.

In an exemplary embodiment, the display device according to an exemplary embodiment may further include a second spacer 112. The second spacer 112 is positioned between the sealing member 250 and the first electrode 431. The second spacer 112 is positioned corresponding to the first spacer 111. In other words, the second spacer 112 is positioned between the first electrode 431 and the first spacer 111. The second spacer 112 may overlap a portion of the pixel defining layer 190.

The second spacer 112 may have an arch-shaped cross-section or a parabolic cross-section that convexly protrudes toward the first electrode 431, as illustrated in FIG. 7.

When an insulating layer 250a closest to the first spacer 111 among the insulating layers 250a, 250b and 250c included in the sealing member 250 is defined as a first insulating layer, the second spacer 112 may have a greater thickness than thicknesses of the other insulating layers 250b and 250c of the sealing member 250 between the first insulating layer 250a and the second spacer 112. For example, as illustrated in FIG. 7, a thickness t1 of the second spacer 112 is greater than a total thickness t2 of the insulating layers (the organic layer 250b and the second inorganic layer 250c) between the first spacer 111 and the second spacer 112.

In the case where the thickness t1 of the second spacer 112 is sufficiently greater than the thickness t2 of the insulating layers 250b and 250c, a pressure applied to the third pressure sensing unit 403 or the periphery of the third pressure sensing unit 403 may be concentrated on the second spacer 112 and the first spacer 111. Accordingly, foreign substances that may be present in the pixel area 500 are hardly affected by the above-described pressure.

The thickness t1 of the second spacer 112 may be about 3 μm and the total thickness t2 of the insulating layers 250b and 250c may be in a range from about 1.5 μm to about 2 μm.

When a strong pressure is applied to the pixel area 500, the pressure may be transmitted to the foreign substances of the pixel area 500 and the stress may be concentrated on a specific portion of the layer at which the foreign substance is positioned, such that the layer may be damaged. For example, the OLED or the pixel electrode 211 of the pixel area 500 may be damaged.

In an exemplary embodiment, the display device according to an exemplary embodiment may further include the second buffer layer 142, and the second buffer layer 142 is positioned on the sealing member 250. Further, the second buffer layer 142 may be further positioned on the second spacer 112. For example, the second buffer layer 142 may be positioned between the sealing member 250 and the elastic element 430, and the second buffer layer 142 may be further positioned between the second spacer 112 and the first electrode 431. The second buffer layer 142 may include an organic material.

The second spacer 112 may have a smaller modulus than a modulus of the second buffer layer 142. In such an exemplary embodiment, the pressure applied to the third pressure sensing unit 403 or the periphery of the third pressure sensing unit 403 may be concentrated to the second spacer 112 and the first spacer 111. Accordingly, foreign substances that may be present in the pixel area 500 are hardly affected by the above-described pressure.

For example, the second spacer 112 may have a modulus ranging from about 0.01 MPa to about 100 MPa and the second buffer layer 142 may have a modulus ranging from about 100 MPa to about 6,000 MPa. As a more specific example, the second spacer 112 may have a modulus of about 0.02 MPa and the second buffer layer 142 may have a modulus of about 3,000 MPa.

Figure 8:
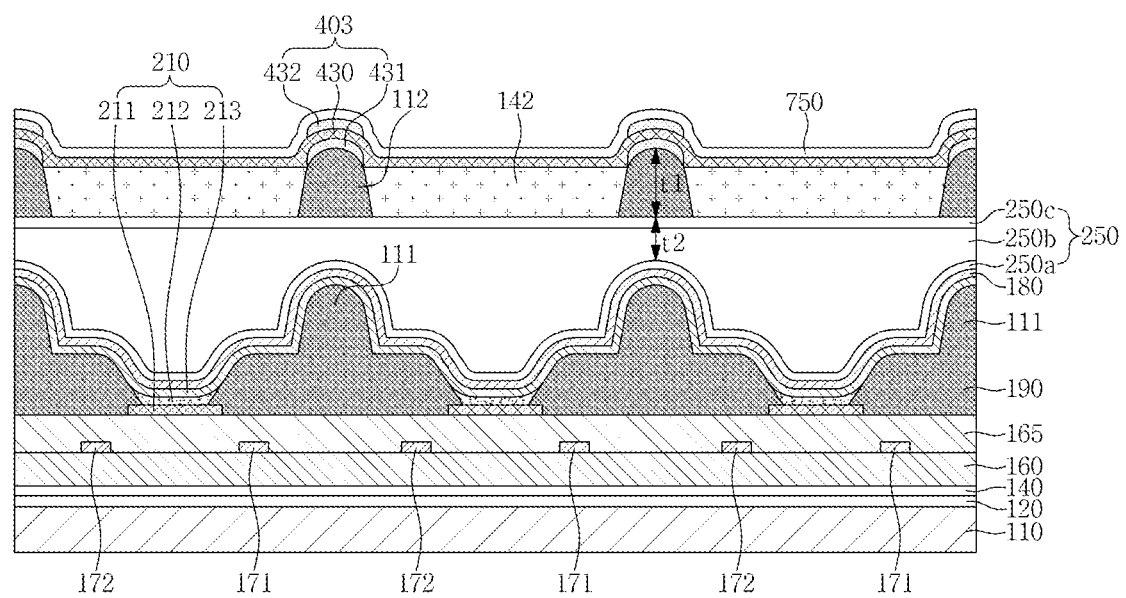
FIG. 8 is another view illustrating a configuration of a third pressure sensing unit and a peripheral portion thereof.

FIG. 8 is another view illustrating a configuration of a third pressure sensing unit 403 and the peripheral portion thereof.

The third pressure sensing unit 403 of FIG. 8 is substantially the same as the third pressure sensing unit 403 of FIG. 7, and thus the detailed structure of the third pressure sensing unit 403 of FIG. 8 will make reference to FIG. 7 and the related descriptions.

A second buffer layer 142 illustrated in FIG. 8 is positioned on a sealing member 250. In other words, the second buffer layer 142 illustrated in FIG. 8 is not positioned between a second spacer 112 and a first electrode 431. In addition, the second buffer layer 142 on the sealing member 250 has a smaller thickness than a thickness of the second spacer 112. Accordingly, a convex portion of the second spacer 112 protrudes above the second buffer layer 142 and the first electrode 431 is positioned at the protruding portion. In such an exemplary embodiment, the first electrode 431 may contact the second spacer 112. Accordingly, as illustrated in FIG. 8, the first electrode 431 and the second electrode 432 have a curved shape. In addition, the elastic element 430 between the first electrode 431 and the second electrode 432 also has a curved shape.

Figure 9:
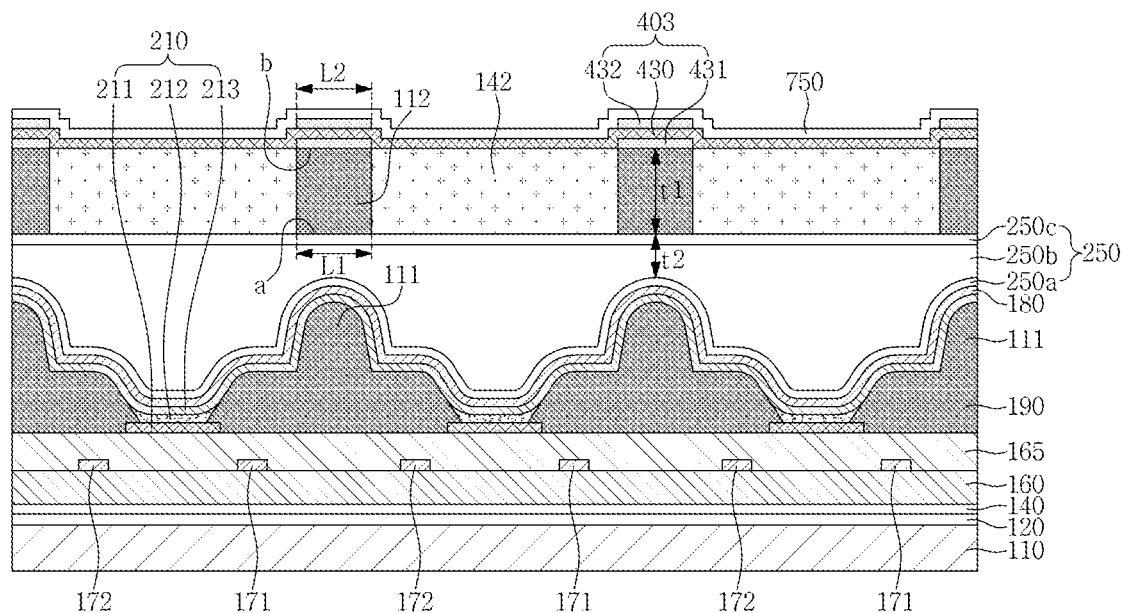
FIG. 9 is still another view illustrating a configuration of a third pressure sensing unit and a peripheral portion thereof.

FIG. 9 is still another view illustrating a configuration of a third pressure sensing unit 403 and a peripheral portion thereof.

The third pressure sensing unit 403 of FIG. 9 is substantially the same as the third pressure sensing unit 403 of FIG. 7, and thus the detailed structure of the third pressure sensing unit 403 of FIG. 9 will make reference to FIG. 7 and the related descriptions.

A second spacer 112 illustrated in FIG. 9 has a right-angled quadrangular cross-section.

A second buffer layer 142 illustrated in FIG. 9 is positioned on a sealing member 250. In other words, the second buffer layer 142 illustrated in FIG. 9 is not positioned between the second spacer 112 and a first electrode 431. In addition, the second buffer layer 142 has a substantially same thickness as a thickness of the second spacer 112.

The first electrode 431 illustrated in FIG. 9 is positioned on the second spacer 112. In such an exemplary embodiment, the first electrode 431 and the second spacer 112 may contact each other.

A length L1 of a first side a of the second spacer 112 facing the sealing member 250 may be substantially the same as a length L2 of a second side b of the second spacer 112 facing the first electrode 431.

Figure 10:
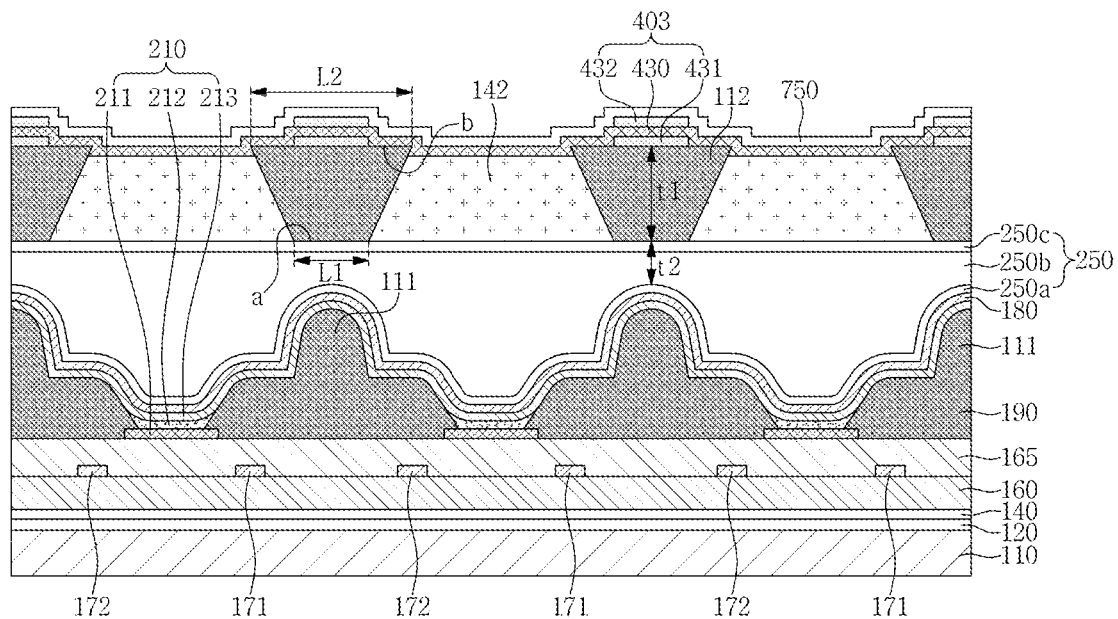
FIG. 10 is yet another view illustrating a configuration of a third pressure sensing unit and a peripheral portion thereof.

FIG. 10 is yet another view illustrating a configuration of a third pressure sensing unit 403 and a peripheral portion thereof.

The third pressure sensing unit 403 of FIG. 10 is substantially the same as the third pressure sensing unit 403 of FIG. 7, and thus the detailed structure of the third pressure sensing unit 403 of FIG. 10 will make reference to FIG. 7 and the related descriptions.

A second spacer 112 illustrated in FIG. 10 has a trapezoidal cross-section.

A second buffer layer 142 illustrated in FIG. 10 is positioned on a sealing member 250. In other words, the second buffer layer 142 illustrated in FIG. 10 is not positioned between the second spacer 112 and a first electrode 431. In addition, the second buffer layer 142 has a smaller thickness than a thickness of the second spacer 112.

The first electrode 431 illustrated in FIG. 10 is positioned on the second spacer 112.

In such an exemplary embodiment, the first electrode 431 and the second spacer 112 may contact each other.

A length L1 of a first side a of the second spacer 112 facing a sealing member 250 is less than a length L2 of a second side b of the second spacer 112 facing the first electrode 431. In such an exemplary embodiment, a pressure applied to the third pressure sensing unit 403 and a periphery of the third pressure sensing unit 403 may be concentrated on a first spacer 111.

FIG. 11 is still yet another view illustrating a configuration of a third pressure sensing unit 403 and a peripheral portion thereof.

The third pressure sensing unit 403 of FIG. 11 is substantially the same as the third pressure sensing unit 403 of FIG. 7, and thus the detailed structure of the third pressure sensing unit 403 of FIG. 11 will make reference to FIG. 7 and the related descriptions.

A second spacer 112 illustrated in FIG. 11 has a trapezoidal cross-section.

Adjacent ones of the second spacers 112 illustrated in FIG. 11 may be connected to each other. For example, respective second sides b of adjacent second spacers 112 may be connected to each other. An air layer may be provided in a space 777 defined by the adjacent second spacers 112 and a sealing member 250. The second spacer 112 has a smaller modulus than a modulus of the air layer. The second spacer 112 of FIG. 11 may include a transparent material.

A first electrode 431 illustrated in FIG. 11 is positioned on the second spacer 112. In such an exemplary embodiment, the first electrode 431 and the second spacer 112 may contact each other.

A length L1 of a first side a of the second spacer 112 facing the sealing member 250 is less than a length L2 of a second side b of the second spacer 112 facing the first electrode 431. In such an exemplary embodiment, a pressure applied to the third pressure sensing unit 403 and a periphery of the third pressure sensing unit 403 may be concentrated on a first spacer 111.

Figure 12:
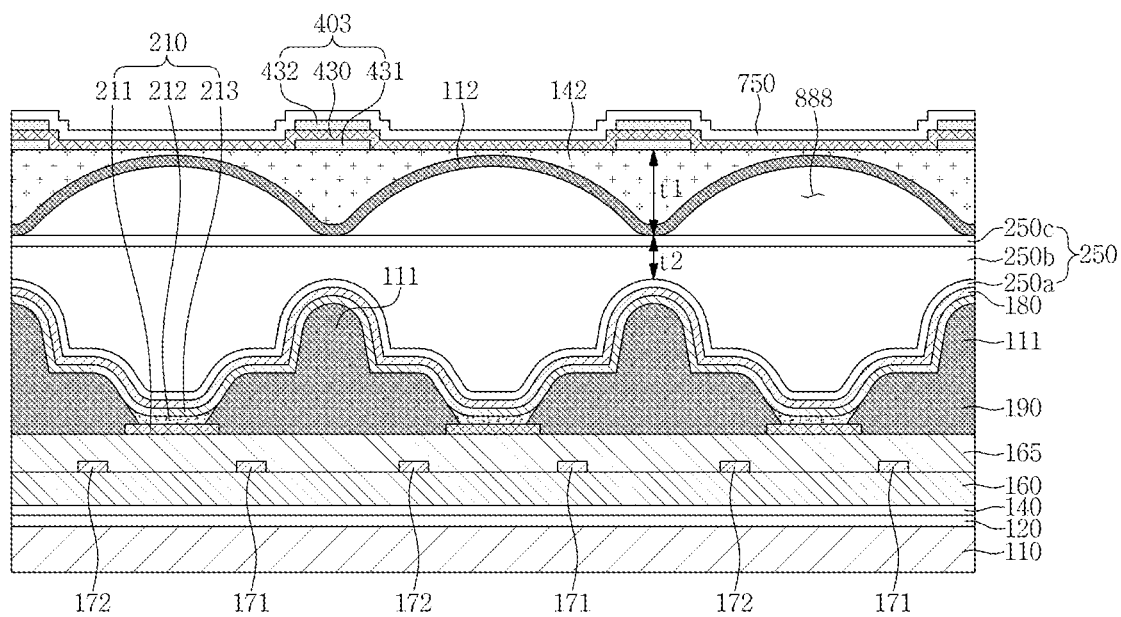
FIG. 12 is still yet another view illustrating a configuration of a third pressure sensing unit and a peripheral portion thereof.

FIG. 12 is still yet another view illustrating a configuration of a third pressure sensing unit 403 and a peripheral portion thereof.

The third pressure sensing unit 403 of FIG. 12 is substantially the same as the third pressure sensing unit 403 of FIG. 7, and thus the detailed structure of the third pressure sensing unit 403 of FIG. 12 will make reference to FIG. 7 and the related descriptions.

A second spacer 112 illustrated in FIG. 12 has an arch-shaped cross-section or a parabolic cross-section. In such an exemplary embodiment, the second spacer 112 of FIG. 12 has an arch-shaped cross-section or a parabolic cross-section that protrudes convexly in a direction opposite to a sealing member 250 in a pixel area 500. Adjacent ones of the second spacers 112 are connected between a first spacer 111 and a first electrode 431. The second spacer 112 of FIG. 12 may include a transparent inorganic material.

An air layer may be provided in a space 888 defined by being surrounded by the second spacer 112 and the sealing member 250 illustrated in FIG. 12.

A second buffer layer 142 illustrated in FIG. 12 may be positioned between the second spacer 112 and the first electrode 431. The second buffer layer 142 may be further positioned between the second spacer 112 and an elastic element 430.

The second buffer layer 142 illustrated in FIG. 12 has a smaller modulus than that of the air layer.

In an exemplary embodiment, in FIG. 12, a thickness t1 indicates a thickness of the second spacer 112 and a thickness of the second buffer layer 142.

Figure 13:
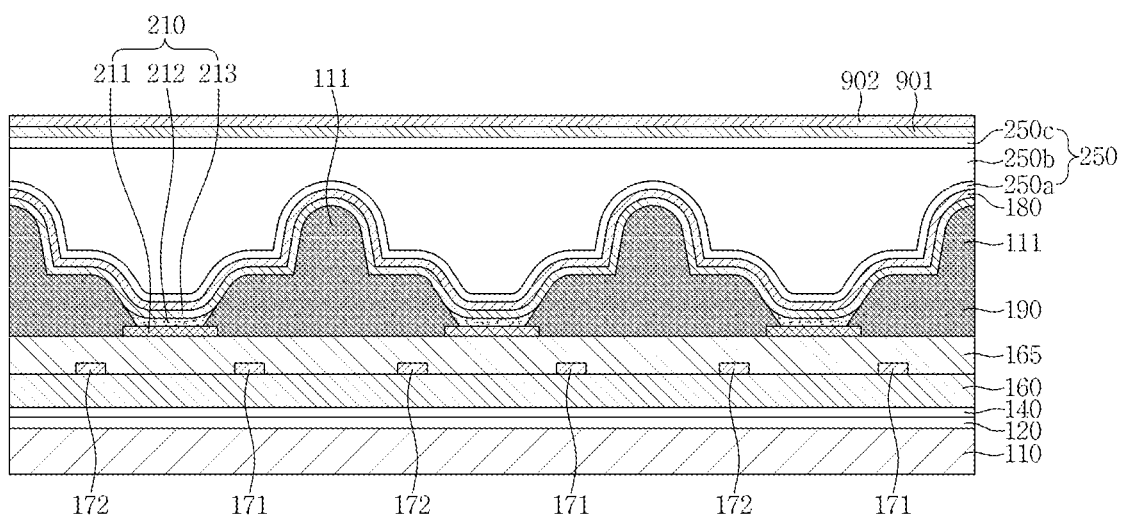
FIG. 13 is another cross-sectional view taken along line II-II' of FIG. 4.

FIG. 13 is another cross-sectional view taken along line II-II' of FIG. 4.

As illustrated in FIG. 13, a display panel 303 may further include a polarizer 901. The polarizer 901 is positioned on a sealing member 250. For example, the polarizer 901 is positioned between an adhesive 902 to be described below and the sealing member 250.

The display device may further include the adhesive 902 between the polarizer 901 and a third pressure sensing unit 403. The adhesive 902 may be an optically clear adhesive (OCA).

As such, in the case where the polarizer 901 and the adhesive 902 are provided, the thickness t2 in FIG. 7 may or may not further include the thickness of at least one of the polarizer 901 and the adhesive 902. As an example, the thickness t2 may include the thickness of the aforementioned organic layer 250b, the thickness of the aforementioned second inorganic layer 250c and the thickness of the adhesive 902. As another example, the thickness t2 may include the thickness of the organic layer 250b, the thickness of the second inorganic layer 250c, the thickness of the polarizer 901 and the thickness of the adhesive 902.

In an exemplary embodiment, although not illustrated, the cross-sectional view of FIG. 6 may further include the polarizer 901 and the adhesive 902 described above.

Figure 14:
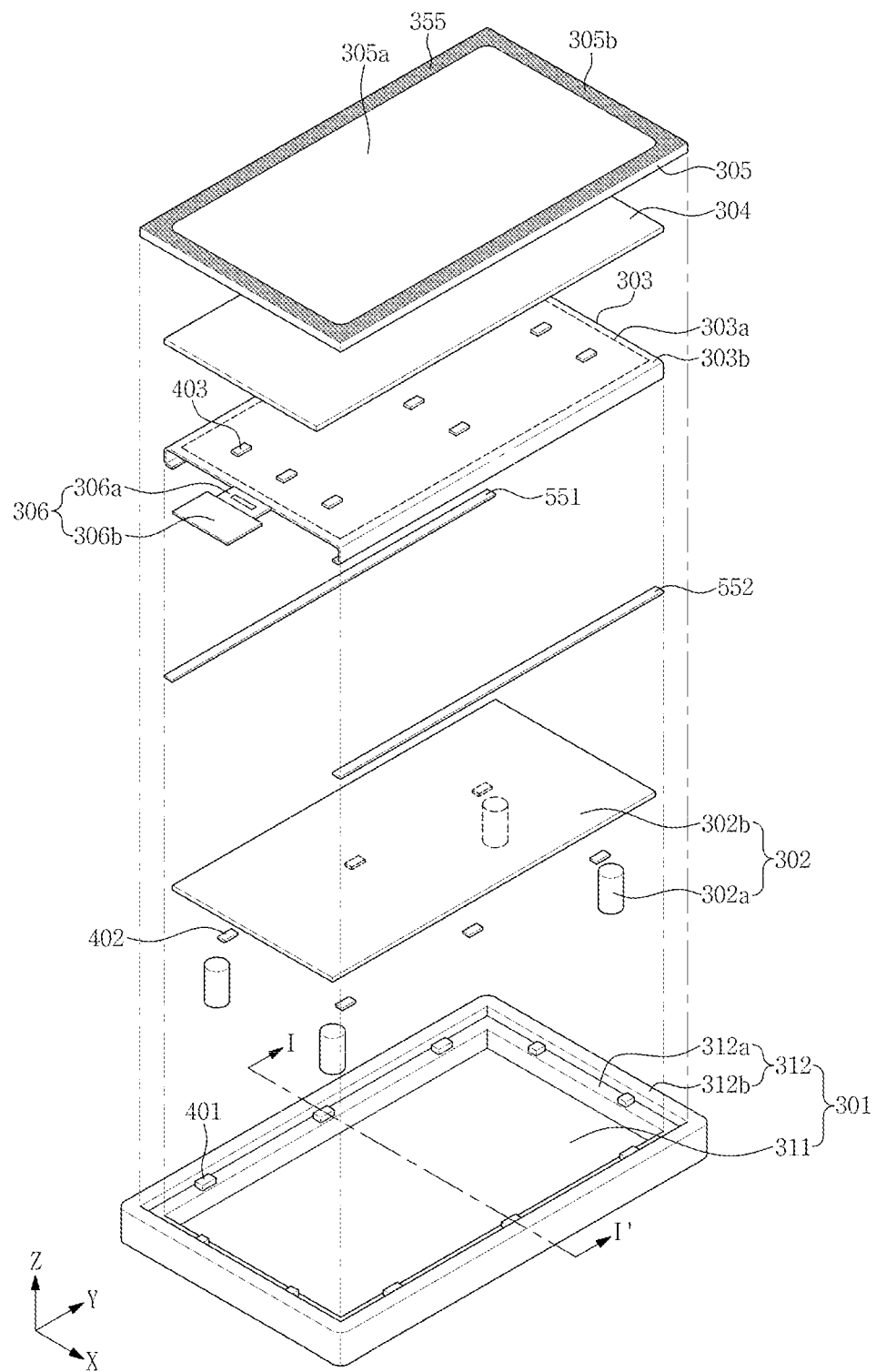
FIG. 14 is an exploded perspective view illustrating a display device according to an alternative exemplary embodiment.
Figure 15:
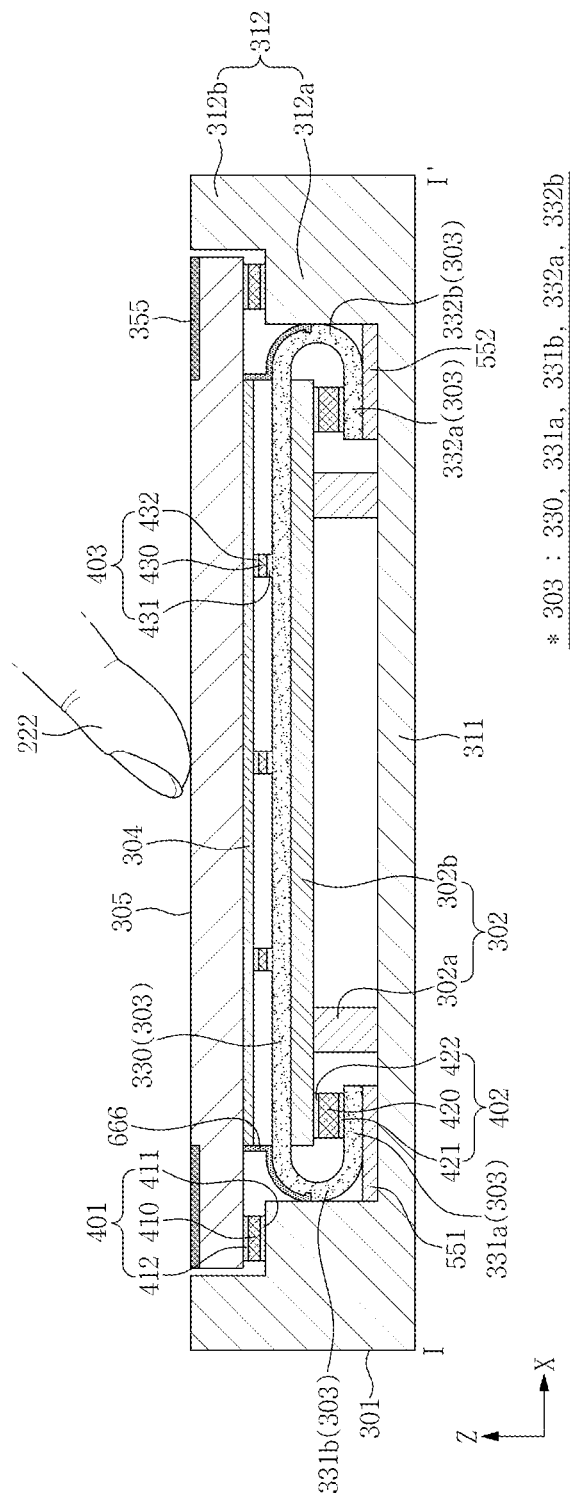
FIG. 15 is a cross-sectional view taken along line I-I' of FIG. 14.

FIG. 14 is an exploded perspective view illustrating a display device according to an alternative exemplary embodiment, and FIG. 15 is a cross-sectional view taken along line I-I' of FIG. 14.

A display device according to an alternative exemplary embodiment may further include at least one of a first buffer portion 551, a second buffer portion 552 and a blocking layer 666, as illustrated in FIGS. 14 and 15.

The first buffer portion 551 is positioned between a first edge portion 331a of a display panel 303 and a base portion 311 of a frame 301.

The first buffer portion 551 may have a bar shape. The bar-shaped first buffer portion 551 may be positioned parallel to two opposing sides of four sides of a side portion 312. For example, as illustrated in FIG. 14, the first buffer portion 551 may be parallel to two opposing sides that have relatively longer lengths of the four sides of the side portion 312. Each of the two sides means a side arranged in a direction parallel to the Y-axis.

The first buffer portion 551 may fasten the display panel 303 to the frame 301. To this end, as an example, one end portion of the first buffer portion 551 is fastened to the first edge portion 331a of the display panel 303 and another end portion of the first buffer portion 551 is fastened to the base portion 311 of the frame 301. In an exemplary embodiment, the first buffer portion 551 may be fastened only to the frame 301, without being fastened to the display panel 303. As another example, the first buffer 551 may be fastened to neither the display panel 303 nor the frame 301.

The first buffer portion 551 may include an elastic material. Accordingly, when the window 305 is pressed by a finger 222 or the like in the Z-axis direction or in a direction close to the Z-axis direction, the first buffer portion 551 may be compressed in accordance with the pressing force. However, when the force is removed, the first buffer portion 551 may be restored to its original shape.

The first buffer portion 551 may include a foam tape.

The second buffer portion 552 is positioned between a second edge portion 332a of the display panel 303 and the base portion 311 of the frame 301.

The second buffer portion 552 may have a bar shape. The bar-shaped second buffer portion 552 may be positioned parallel to two opposing sides of the four sides of the side portion 312. For example, as illustrated in FIG. 14, the second buffer portion 552 may be parallel to two opposing sides that have relatively longer lengths of the four sides of the side portion 322. Each of the two sides means a side arranged in a direction parallel to the Y-axis.

The second buffer portion 552 may fasten the display panel 303 to the frame 301. To this end, as an example, one end portion of the second buffer portion 552 is fastened to the second edge portion 332a of the display panel 303 and another end portion of the second buffer portion 552 is fastened to the base portion 311 of the frame 301. In an exemplary embodiment, the second buffer portion 552 may be fastened only to the frame 301, without being fastened to the display panel 303. As another example, the second buffer 552 may be fastened to neither the display panel 303 nor the frame 301.

The second buffer portion 552 may include an elastic material. Accordingly, when the window 305 is pressed by the finger 222 or the like in the Z-axis direction or in a direction close to the Z-axis direction, the second buffer portion 552 may be compressed in accordance with the pressing force. However, when the force is removed, the second buffer portion 552 may be restored to its original shape.

The second buffer portion 552 may include a foam tape.

As illustrated in FIG. 14, the first buffer portion 552 and the second buffer portion 552 are parallel to each other. In addition, as illustrated in FIG. 15, the first buffer portion 552 and the second buffer portion 552 face each other.

As illustrated in FIGS. 14 and 15, a panel support 302a may include a plurality of supports 302a having a cylindrical shape. The plurality of supports 302a are positioned between a support plate 302b and the base portion 311 of the frame 301. In such an exemplary embodiment, as illustrated in FIG. 15, each of the supports 302a may be positioned corresponding to four corner portions of the support plate 302b.

In an exemplary embodiment, elastic members 410, 420 and 430 of first, second and third pressure sensing units 401, 402 and 403 included in the display device of FIG. 14 may include the above-described materials. In such an exemplary embodiment, since an organic material of the elastic material 410 included in the first pressure sensing unit 401 has a low water vapor transmission rate (WVTR) or a low oxygen transmission rate (OTR), external air or moisture may penetrate into the display panel 303.

In order to substantially prevent this, as illustrated in FIG. 15, the display device according to an exemplary embodiment may further include the blocking layer 666. The blocking layer 666 may be positioned in a non-display area 303b of the display panel 303. In such an exemplary embodiment, the blocking layer 666 may be positioned at a portion of a first curved portion 331b of the display panel 303 that is adjacent to the first pressure sensing unit 401 and a portion of a second curved portion 332b of the display panel 303 that is adjacent to the first pressure sensing unit 401.

In such an exemplary embodiment, although not illustrated, the blocking layer 666 may have a ring shape surrounding a display area 303a of the display panel 303. For example, the blocking layer 666 may have a quadrangular shape surrounding the display area 303a of the display panel 303, and one side (hereinafter, "a first side") of four sides of the blocking layer 666 is positioned between the first curved portion 331b and the display area 303a, another side (hereinafter, "a second side") of the four sides of the blocking layer 666 facing the first side is positioned between the second curved portion 332b and the display area 303a, another side (hereinafter, "a third side") of the four sides of the blocking layer 666 is positioned between an edge of the display panel 303 and the display area 303a, and the other side (hereinafter, "a fourth side") of the blocking layer 666 is positioned between another edge of the display panel 303 and the display area 303a. In such an exemplary embodiment, the first side and the second side may be longer than the third side and the fourth side.

The blocking layer 666 may contact the display panel 303. In addition, the blocking layer 666 may protrude from the display panel 303 toward the window 305, and in such an exemplary embodiment, the protruding portion may contact the window 305.

In an exemplary embodiment, the display device of FIG. 1 may further include at least one of the first buffer portion 551, the second buffer portion 552 and the blocking layer 666 described above.

As set forth hereinabove, the display device according to one or more exemplary embodiments may provide the following effects.

First, the display device senses a touch through pressure sensing units having different sensitivities. Accordingly, the sensing errors may be substantially minimized. In addition, since the respective pressure sensing units include elastic elements having different thicknesses, it is advantageous for slimming down the display device.

Second, the display device includes a spacer disposed correspondingly on a pixel defining layer. When a touch action is performed to apply a pressure to the spacer, the spacer serves to concentrate the pressure to the pixel defining layer. Accordingly, foreign substances that may be present in a pixel area are hardly affected by the above-described pressure.

Third, the display device may sense a touch of a strong pressure when the touch occurs and display a warning message on the display panel. Accordingly, damage to the display device may be effectively prevented.

While the present inventive concept has been illustrated and described with reference to the exemplary embodiments thereof, it will be apparent to those of ordinary skill in the art that various changes in form and detail may be formed thereto without departing from the spirit and scope of the present inventive concept.

What is claimed is:

1. A display device comprising:
   a frame;
   a window facing at least a portion of the frame;
   a support plate disposed between the window and a base portion of the frame;
   a flexible display panel comprising a central portion between the support plate and the window and an edge portion between the support plate and the base portion of the frame; and
   a second pressure sensing unit between the edge portion of the flexible display panel and the support plate,
   wherein the second pressure sensing unit directly contacts the support plate.

2. The display device as claimed in claim 1, further comprising at least one of:
   a first pressure sensing unit between a side portion protruding from an edge of the frame and an edge of the window; and
   a third pressure sensing unit between the flexible display panel and the window.

3. The display device as claimed in claim 2, wherein at least two pressure sensing units of the first, second and third pressure sensing units have different sensitivities.

4. The display device as claimed in claim 3, wherein the third pressure sensing unit has a highest sensitivity among the first, second, and third pressure sensing units,
   the first pressure sensing unit has a lowest sensitivity among the first, second, and the third pressure sensing units, and
   the second pressure sensing unit has a sensitivity higher than the sensitivity of the first pressure sensing unit and less than the sensitivity of the third pressure sensing unit.

5. The display device as claimed in claim 2, wherein at least two pressure sensing units of the first, second and third pressure sensing units include elastic elements having different moduli.

6. The display device as claimed in claim 5, wherein the third pressure sensing unit comprises an elastic element having a greatest modulus among the first, second, and the third pressure sensing units,
   the first pressure sensing unit comprises an elastic element having a smallest modulus among the first, second, and the third pressure sensing units, and
   the second pressure sensing unit comprises an elastic element having a modulus that is greater than the modulus of the first pressure sensing unit and less than the modulus of the third pressure sensing unit.

7. The display device as claimed in claim 5, wherein the elastic element of the second pressure sensing unit has a thickness greater than or equal to a thickness of the elastic element of the first pressure sensing unit, and
   the elastic element of the third pressure sensing unit has a thickness less than the thickness of the elastic element of the second pressure sensing unit.

8. The display device as claimed in claim 4, further comprising a panel driving unit controlling an operation of the flexible display panel based on a first pressure sensing signal from the first pressure sensing unit, a second pressure sensing signal from the second pressure sensing unit and a third pressure sensing signal from the third pressure sensing unit.

9. The display device as claimed in claim 8, wherein the panel driving unit displays a warning message or a warning symbol on a display area of the flexible display panel, according to the third pressure sensing signal.

10. The display device as claimed in claim 2, wherein the flexible display panel comprises:
    a substrate on the support plate;
    a pixel electrode on the substrate;
    a common electrode on the pixel electrode;
    a light emitting element layer between the pixel electrode and the common electrode;
    a pixel defining layer overlapping a portion of the pixel electrode to define a pixel area; and
    a sealing member on the pixel defining layer and the pixel area.

11. The display device as claimed in claim 10, wherein the flexible display panel further comprises a first spacer between the pixel defining layer and the sealing member, the first spacer positioned corresponding to the third pressure sensing unit.

12. The display device as claimed in claim 10, wherein the third pressure sensing unit comprises:
    a first electrode on the sealing member, the first electrode positioned corresponding to the pixel defining layer;
    a second electrode on the first electrode; and
    an elastic element between the first electrode and the second electrode.

13. The display device as claimed in claim 11, further comprising a second spacer between the sealing member and the first electrode.

14. The display device as claimed in claim 13, wherein the second spacer has a greater thickness than a thickness of an insulating layer except another insulating layer that is most adjacent to the first spacer, among insulating layers of the sealing member between the first spacer and the second spacer.

15. The display device as claimed in claim 13, further comprising a buffer layer on the sealing member.

16. The display device as claimed in claim 15, wherein the second spacer has a modulus less than a modulus of the buffer layer.

17. The display device as claimed in claim 15, wherein the buffer layer has a thickness less than a thickness of the second spacer.

18. The display device as claimed in claim 15, wherein the buffer layer is further disposed between the second spacer and the first electrode.

19. The display device as claimed in claim 18, wherein the buffer layer positioned corresponding to the pixel area has a greater thickness than the thickness of the second spacer.

20. The display device as claimed in claim 13, wherein the second spacer has an arch-shaped or parabolic cross-section convexly protruding toward the first electrode.

21. The display device as claimed in claim 13, wherein a length of a first side of the second spacer facing the sealing member is substantially equal to or different from a length of a second side of the second spacer facing the first electrode.

22. The display device as claimed in claim 21, wherein the length of the first side is longer than the length of the second side.

23. The display device as claimed in claim 11, further comprising at least one second spacer on the sealing member, wherein a length of a first side of the at least one second spacer facing the sealing member is less than a length of a second side of the at least one second spacer facing the first electrode.

24. The display device as claimed in claim 23, wherein the second sides of adjacent ones of the second spacers are connected to each other, and
the display device further comprises an air layer positioned in a space defined by the adjacent second spacers and the sealing member.

25. The display device as claimed in claim 11, further comprising a second spacer on the sealing member,
wherein the second spacer has an arch shape or a parabolic shape protruding convexly in a direction opposite to the sealing member positioned in a pixel area.

26. The display device as claimed in claim 25, further comprising an air layer positioned in a space defined by the second spacer and the sealing member.

* * * * *